United States Patent
Sankar et al.

(10) Patent No.: US 11,044,048 B2
(45) Date of Patent: Jun. 22, 2021

(54) PUNCTURING AND REPETITION FOR INFORMATION ENCODING

(71) Applicant: QUALCOMM Incorporated, San Diego, CA (US)

(72) Inventors: Hari Sankar, San Diego, CA (US); Gabi Sarkis, San Diego, CA (US); Changlong Xu, Beijing (CN); Alexei Gorokhov, San Diego, CA (US); Jing Jiang, San Diego, CA (US); Joseph Binamira Soriaga, San Diego, CA (US); Jilei Hou, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/470,881

(22) PCT Filed: Jan. 12, 2018

(86) PCT No.: PCT/CN2018/072319
§ 371 (c)(1),
(2) Date: Jun. 18, 2019

(87) PCT Pub. No.: WO2018/130185
PCT Pub. Date: Jul. 19, 2018

(65) Prior Publication Data
US 2020/0092041 A1   Mar. 19, 2020

Related U.S. Application Data

(63) Continuation of application No. PCT/CN2018/072319, filed on Jan. 12, 2018.

(30) Foreign Application Priority Data

Jan. 12, 2017   (WO) ............... PCT/CN2017/070985

(51) Int. Cl.
*H04L 1/00* (2006.01)
*H03M 13/13* (2006.01)
(Continued)

(52) U.S. Cl.
CPC .......... *H04L 1/0069* (2013.01); *H03M 13/13* (2013.01); *H03M 13/6356* (2013.01);
(Continued)

(58) Field of Classification Search
CPC ..... H04L 1/0069; H04L 1/0057; H04L 5/006; H03M 13/13; H03M 13/6356; H03M 13/6362
See application file for complete search history.

(56) References Cited

U.S. PATENT DOCUMENTS

| 8,904,265 B2 | 12/2014 | Shen et al. |
| 2002/0186778 A1* | 12/2002 | Agami .................. H04L 1/0041 375/261 |

(Continued)

FOREIGN PATENT DOCUMENTS

| CN | 101834694 A | 9/2010 |
| EP | 3151435 A1 | 4/2017 |

(Continued)

OTHER PUBLICATIONS

3GPP TSG RAN WG1 Meeting #xx R1-164039 Nanjing, China, May 23-27, 2016 (Year: 2016).*

(Continued)

*Primary Examiner* — Benjamin H Elliott, IV
(74) *Attorney, Agent, or Firm* — Terry Tsai

(57) ABSTRACT

The disclosure relates in some aspects to information encoding. Information encoding may involve puncturing bits of a codeword or repeating bits of a codeword. The disclosure relates in some aspects to selecting a puncturing or repetition pattern. In some aspects, a puncture pattern for data encod- (Continued)

ing is selected based on a criterion that the output and the repetition input of an XOR are not erased. In some aspects, a repetition pattern for data encoding is selected based on a criterion that repetition not be applied for the output and the repetition input of an XOR.

56 Claims, 20 Drawing Sheets

(51) Int. Cl.
*H03M 13/00* (2006.01)
*H04L 5/00* (2006.01)

(52) U.S. Cl.
CPC ...... *H03M 13/6362* (2013.01); *H04L 1/0057* (2013.01); *H04L 5/006* (2013.01)

(56) References Cited

U.S. PATENT DOCUMENTS

| | | | | |
|---|---|---|---|---|
| 2004/0139378 A1* | 7/2004 | Akhter | ............... | H04L 1/0069 714/755 |
| 2004/0240590 A1* | 12/2004 | Cameron | ............ | H03M 13/3927 375/340 |
| 2006/0036929 A1* | 2/2006 | Yoon | ............... | H04L 1/08 714/774 |
| 2007/0268168 A1* | 11/2007 | Jensen | ............... | H04L 27/361 341/143 |
| 2008/0043878 A1* | 2/2008 | Cameron | ............ | H03M 13/3988 375/295 |
| 2008/0225982 A1* | 9/2008 | Chrabieh | ............ | H04L 1/08 375/299 |
| 2008/0276153 A1* | 11/2008 | Shen | ............... | H04L 1/0068 714/790 |
| 2010/0125764 A1* | 5/2010 | Kose | ............... | H03M 13/3738 714/704 |
| 2011/0235751 A1* | 9/2011 | Liang | ............... | H04L 27/34 375/298 |
| 2013/0272443 A1* | 10/2013 | Subramanian | ........ | H04L 1/0042 375/295 |
| 2016/0241357 A1* | 8/2016 | Jeong | ............... | H04L 1/0041 |
| 2018/0234111 A1* | 8/2018 | Shelby | ............... | H04H 60/07 |
| 2020/0092035 A1* | 3/2020 | Zhang | ............... | H03M 13/611 |
| 2020/0092041 A1* | 3/2020 | Sankar | ............ | H03M 13/6362 |
| 2020/0162190 A1* | 5/2020 | Zhang | ............... | H04N 21/438 |

FOREIGN PATENT DOCUMENTS

| | | |
|---|---|---|
| GB | 2539925 A | 1/2017 |
| WO | 2008115828 A1 | 9/2008 |
| WO | 2015182102 A1 | 12/2015 |

OTHER PUBLICATIONS

3GPP TSG RAN WG1 Meeting #86bis R1-1609898 Lisbon, Portugal, Oct. 10-14, 2016 (Year: 2016).*
International Search Report and Written Opinion—PCT/CN2017/070985—ISA/EPO—dated Oct. 20, 2017.
International Search Report and Written Opinion—PCT/CN2018/072319—ISA/EPO—dated Mar. 28, 2018.
Huawei et al., "Channel Coding Schemes for mMTC Scenario", 3GPP Draft; R1-167215 Channel Coding Schemes for MMTC Scenario, 3rd Generation Partnership Project (3GPP), Mobile Competence Centre ; 650, Route Des Lucioles; F-06921 Sophia-Antipolis Cedex; France, vol. RAN WG1, No. Gothenburg, Sweden; Aug. 22, 2016-Aug. 26, 2016, Aug. 13, 2016 (Aug. 13, 2016), XP051142538, 9 Pages.
Mediatek Inc: "Examination of NR Coding Candidates for Low-Rate Applications", 3GPP Draft, 3GPP TSG RAN WG1 Meeting #86, R1-167871 Examination of NR Coding Candidates for Low-Rate Applications, 3rd Generation Partnership Project (3GPP), Mobile Competence Centre, 650, Route Des Lucioles, F-06921 Sophia-Anti, vol. RAN WG1, No. Gothenburg, Sweden, Aug. 22, 2016-Aug. 26, 2016, Aug. 28, 2016 (Aug. 28, 2016), XP051142643, 15 Pages.
Supplementary Partial European Search Report—EP18739077—Search Authority—Munich—dated Nov. 16, 2020.

* cited by examiner

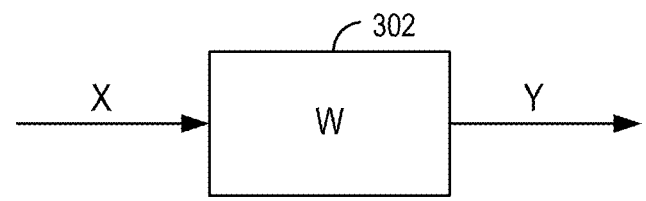
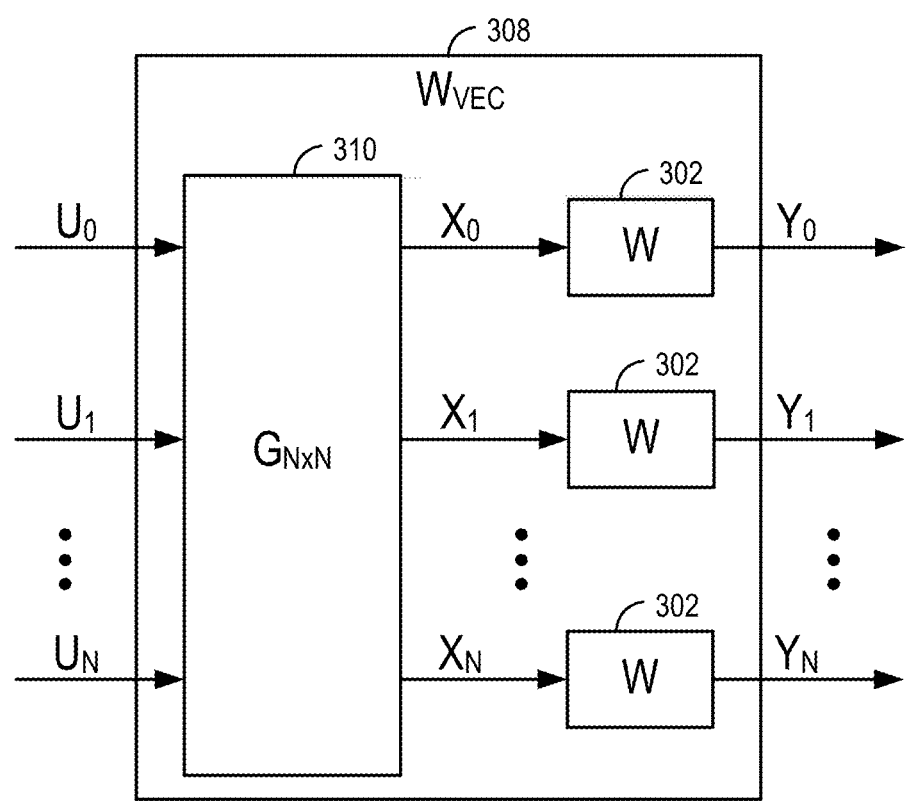
FIG. 3

PUNCTURING AND REPETITION FOR INFORMATION ENCODING

CROSS-REFERENCE TO RELATED APPLICATION(S)

This application is the U.S. national stage of PCT patent application number PCT/CN2018/072319 filed on Jan. 12, 2018 which claims priority to and benefit of PCT patent application number PCT/CN2017/070985 filed on Jan. 12, 2017, the content of each of which is incorporated herein by reference.

INTRODUCTION

Various aspects described herein relate to communication, and more particularly, but not exclusively, to information encoding employing puncturing and repetition.

A wireless communication system may use error correcting codes to facilitate reliable transmission of digital messages over noisy channels. A block code is one type of error correcting code. In a typical block code, an information message or sequence is split up into blocks, and an encoder at the transmitting device mathematically adds redundancy to the information message. Exploitation of this redundancy in the encoded information message improves the reliability of the message, enabling correction for bit errors that may occur due to the noise. That is, a decoder at the receiving device can take advantage of the redundancy to reliably recover the information message even though bit errors may occur, in part, due to the addition of noise by the channel. Examples of error correcting block codes include Hamming codes, Bose-Chaudhuri-Hocquenghem (BCH) codes, and turbo codes among others. Many existing wireless communication networks utilize such block codes, such as 3GPP LTE networks, which utilize turbo codes, and IEEE 802.11n Wi-Fi networks.

The block size specified by a block code might not match a block size associated with data being encoded. For example, a specific block size (e.g., a resource block size) may be specified for sending data over a particular resource. Puncturing and repetition of encoded data are two techniques that may be used to adjust the block size of encoded data. In practice, puncturing or repetition may affect communication performance. Accordingly, there is a need for efficient puncturing or repetition techniques.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

In one aspect, the disclosure provides an apparatus configured for communication that includes an interface, a memory, and a processor coupled to the memory and the interface. The interface is configured to obtain data. The processor and the memory are configured to: encode the data to generate a codeword, and modify the codeword according to a puncture pattern that is based on a plurality of bit tuples, wherein at most one bit of a particular bit tuple of the plurality of bit tuples is designated as a puncture bit. The interface is further configured to output (e.g., transmit) the modified codeword. In some implementations, the interface may include a first interface (e.g., for obtaining data) and a second interface (e.g., for outputting the modified codeword).

Another aspect of the disclosure provides a method for communication including: obtaining data; encoding the data to generate a codeword; modifying the codeword according to a puncture pattern that is based on a plurality of bit tuples, wherein at most one bit of a particular bit tuple of the plurality of bit tuples is designated as a puncture bit; and outputting (e.g., transmitting) the modified codeword.

Another aspect of the disclosure provides an apparatus configured for communication. The apparatus including: means for obtaining data; means for encoding the data to generate a codeword; means for modifying the codeword according to a puncture pattern that is based on a plurality of bit tuples, wherein at most one bit of a particular bit tuple of the plurality of bit tuples is designated as a puncture bit; and means for outputting (e.g., transmitting) the modified codeword.

Another aspect of the disclosure provides a non-transitory computer-readable medium storing computer-executable code, including code to: obtain data; encode the data to generate a codeword; modify the codeword according to a puncture pattern that is based on a plurality of bit tuples, wherein at most one bit of a particular bit tuple of the plurality of bit tuples is designated as a puncture bit; and output (e.g., transmit) the modified codeword.

In one aspect, the disclosure provides an apparatus configured for communication that includes an interface, a memory, and a processor coupled to the memory and the interface. The interface is configured to obtain data. The processor and the memory are configured to: encode the data to generate a codeword, and modify the codeword according to a repetition pattern that is based on a plurality of bit tuples, wherein at most one bit of a particular bit tuple of the plurality of bit tuples is designated as a repeated bit. The interface is further configured to output (e.g., transmit) the modified codeword. In some implementations, the interface may include a first interface (e.g., for obtaining data) and a second interface (e.g., for outputting the modified codeword).

Another aspect of the disclosure provides a method for communication including: obtaining data; encoding the data to generate a codeword; modifying the codeword according to a repetition pattern that is based on a plurality of bit tuples, wherein at most one bit of a particular bit tuple of the plurality of bit tuples is designated as a repeated bit; and outputting (e.g., transmitting) the modified codeword.

Another aspect of the disclosure provides an apparatus configured for communication. The apparatus including: means for obtaining data; means for encoding the data to generate a codeword; means for modifying the codeword according to a repetition pattern that is based on a plurality of bit tuples, wherein at most one bit of a particular bit tuple of the plurality of bit tuples is designated as a repeated bit; and means for outputting (e.g., transmitting) the modified codeword.

Another aspect of the disclosure provides a non-transitory computer-readable medium storing computer-executable code, including code to: obtain data; encode the data to generate a codeword; modify the codeword according to a repetition pattern that is based on a plurality of bit tuples, wherein at most one bit of a particular bit tuple of the plurality of bit tuples is designated as a repeated bit; and output (e.g., transmit) the modified codeword.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

The accompanying drawings are presented to aid in the description of aspects of the disclosure and are provided solely for illustration of the aspects and not limitations thereof.

FIG. 3 is a diagram of an example of a representation of a communication channel.

DETAILED DESCRIPTION

Figure 1:
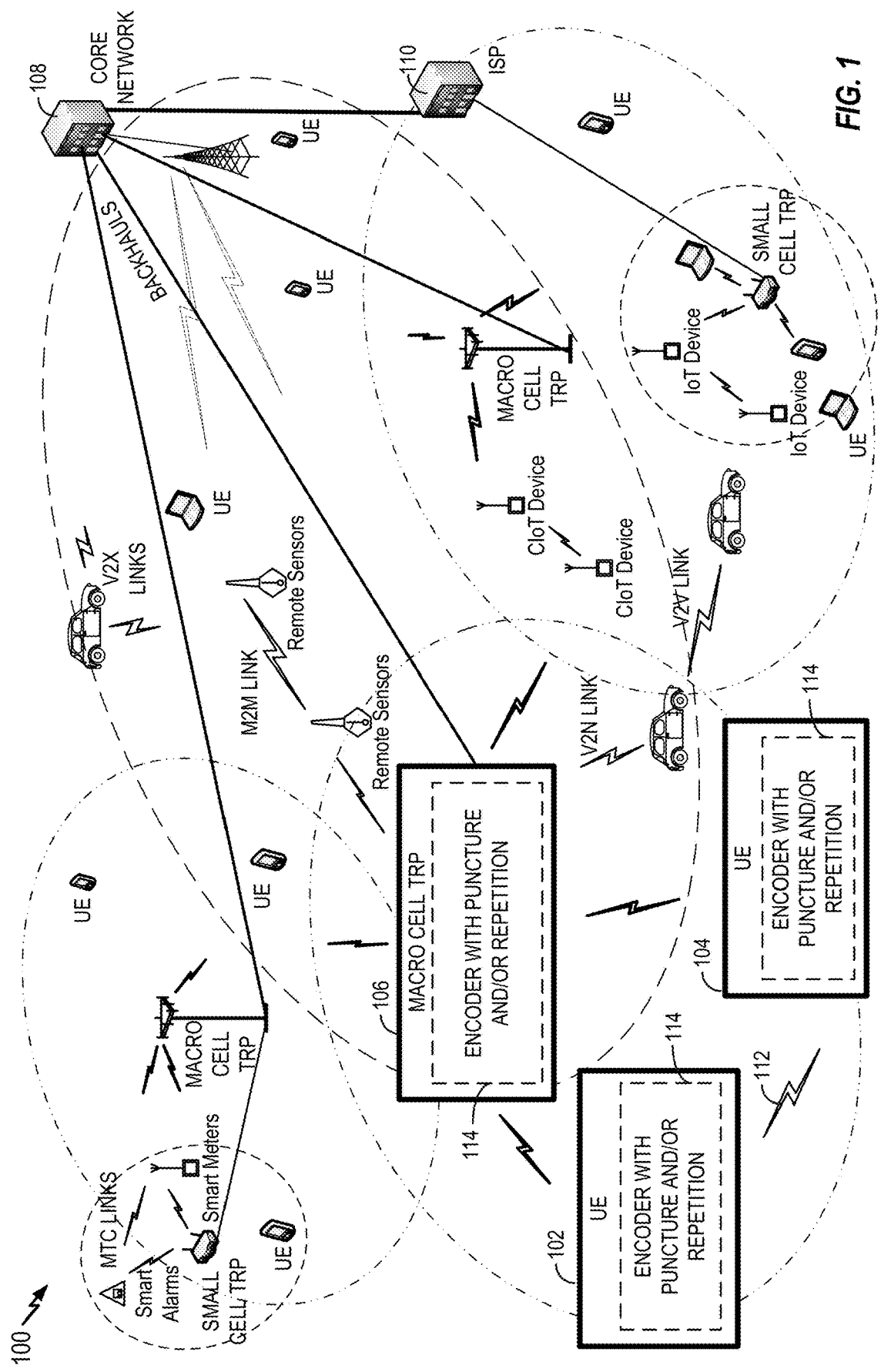
FIG. 1 is a block diagram of an example communication system in which aspects of the disclosure may be used.

Various aspects of the disclosure relate to encoding for communication of information (e.g., for wireless communication). In some aspects, the encoding may involve puncturing bits of a codeword or repeating bits of a codeword. As one example, for data encoding with block codes such as Polar codes, the codeword length N may be a power-of-two. Thus, data encoding may use puncturing or repetition to match the codeword size with the resource allocation (which might not correspond to a power-of-two). As another example, data encoding may use puncturing or repetition to improve decoding performance at a receiver. The present disclosure relates in some aspects to selecting a puncturing or repetition pattern that may provide improved performance. In some aspects, a puncture pattern for data encoding is selected based on a criterion that the output and a repetition input of an XOR are not erased. In some aspects, a repetition pattern for data encoding is selected based on a criterion that repetition not be applied for the output and a repetition input of an XOR.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. Moreover, alternate configurations may be devised without departing from the scope of the disclosure. Additionally, well-known elements will not be described in detail or will be omitted so as not to obscure the relevant details of the disclosure.

The various concepts presented throughout this disclosure may be implemented across a broad variety of telecommunication systems, network architectures, and communication standards. For example, the 3rd Generation Partnership Project (3GPP) is a standards body that defines several wireless communication standards for networks involving the evolved packet system (EPS), frequently referred to as long-term evolution (LTE) networks. Evolved versions of the LTE network, such as a fifth-generation (5G) network, may provide for many different types of services or applications, including but not limited to web browsing, video streaming, VoIP, mission critical applications, multi-hop networks, remote operations with real-time feedback (e.g., tele-surgery), etc. Thus, the teachings herein can be implemented according to various network technologies including, without limitation, 5G technology, fourth generation (4G) technology, third generation (3G) technology, and other network architectures. Also, the techniques described herein may be used for a downlink, an uplink, a peer-to-peer link, or some other type of link.

The actual telecommunication standard, network architecture, and/or communication standard used will depend on the specific application and the overall design constraints imposed on the system. For purposes of illustration, the following may describe various aspects in the context of a 5G system and/or an LTE system. It should be appreciated, however, that the teachings herein may be used in other systems as well. Thus, references to functionality in the context of 5G and/or LTE terminology should be understood to be equally applicable to other types of technology, networks, components, signaling, and so on.

Example Communication System

FIG. 1 illustrates an example of a wireless communication system 100 where a user equipment (UE) can communicate with other devices via wireless communication signaling. For example, a first UE 102 and a second UE 104 may communicate with a transmit receive point (TRP) 106 using wireless communication resources managed by the TRP 106 and/or other network components (e.g., a core network 108, an internet service provider (ISP) 110, peer devices, and so on). In some implementations, one or more of the components of the system 100 may communicate with each other directly via a device-to-device (D2D) link 112 or some other similar type of direct link.

Communication of information between two or more of the components of the system 100 may involve encoding the information. For example, the TRP 106 may encode data (e.g., user data or control information) that the TRP 106 sends to the UE 102 or the UE 104. As another example, the UE 102 may encode data (e.g., user data or control information) that the UE 102 sends to the TRP 106 or the UE 104. The encoding may involve block coding such as Polar coding. In accordance with the teachings herein, one or more of the UE 102, the UE 104, the TRP 106, or some other component of the system 100 may include an encoder with puncture and/or repetition 114.

The components and links of the wireless communication system 100 may take different forms in different implementations. Examples of UEs may include, without limitation, cellular devices, Internet of Things (IoT) devices, cellular IoT (CIoT) devices, LTE wireless cellular devices, machine-type communication (MTC) cellular devices, smart alarms, remote sensors, smart phones, mobile phones, smart meters, personal digital assistants (PDAs), personal computers, mesh nodes, and tablet computers.

In some aspects, a TRP may refer to a physical entity that incorporates radio head functionality for a particular physical cell. In some aspects, the TRP may include 5G new radio (NR) functionality with an air interface based on orthogonal frequency division multiplexing (OFDM). NR may support, for example and without limitation, enhanced mobile broadband (eMBB), mission-critical services, and wide-scale deployment of IoT devices. The functionality of a TRP may be similar in one or more aspects to (or include or be incorporated into) the functionality of a CIoT base station (C-BS), a NodeB, an evolved NodeB (eNodeB), radio access network (RAN) access node, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other suitable entity. In different scenarios (e.g., NR, LTE, etc.), a TRP may be referred to as a gNodeB (gNB), an eNB, a base station, or referenced using other terminology.

Figure 2:
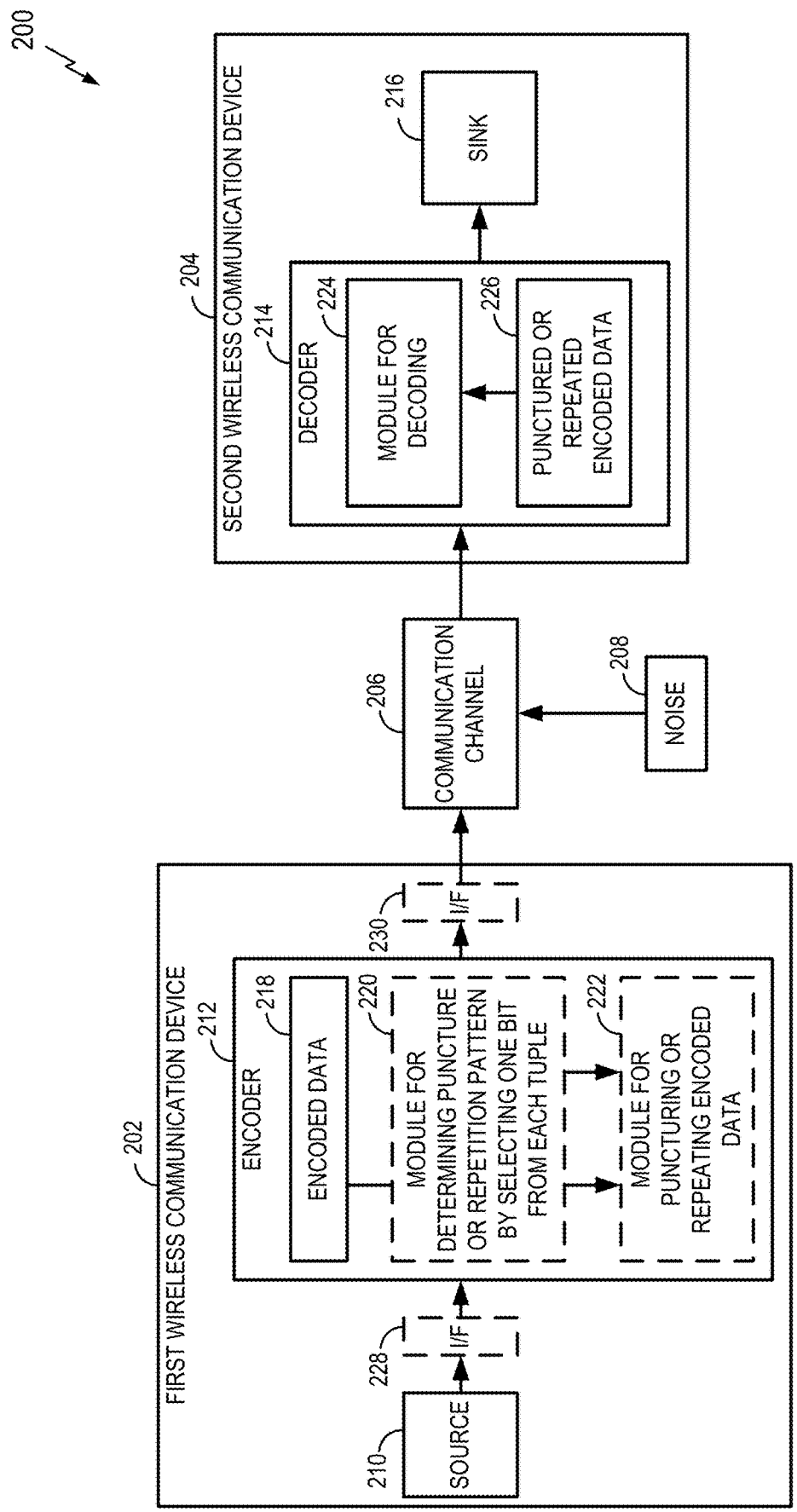
FIG. 2 is a block diagram of example communication devices in which aspects of the disclosure may be used.

Various types of network-to-device links and D2D links may be supported in the wireless communication system 100. For example, D2D links may include, without limitation, machine-to-machine (M2M) links, MTC links, vehicle-to-vehicle (V2V) links, and vehicle-to-anything (V2X) links Network-to-device links may include, without limitation, uplinks (or reverse links), downlinks (or forward links), and vehicle-to-network (V2N) links Example Communication Components FIG. 2 is a schematic illustration of a wireless communication system 200 that includes a first wireless communication device 202 and a second wireless communication device 204 that may use the teachings herein. In some implementations, the first wireless communication device 202 or the second wireless communication device 204 may correspond to the UE 102, the UE 104, the TRP 106, or some other component of FIG. 1.

In the illustrated example, the first wireless communication device 202 transmits a message over a communication channel 206 (e.g., a wireless channel) to the second wireless communication device 204. One issue in such a scheme that should be addressed to provide for reliable communication of the message, is to take into account noise 208 that affects the communication channel 206.

Block codes or error correcting codes are frequently used to provide reliable transmission of messages over noisy channels. In a typical block code, an information message or sequence from an information source 210 at the first (transmitting) wireless communication device 202 is split up into blocks, each block having a length of K bits. An encoder 212 mathematically adds redundancy to the information message, resulting in codewords having a length of N, where N>K. Here, the code rate R is the ratio between the message length and the block length (i.e., R=K/N). Exploitation of this redundancy in the encoded information message is a key to reliably receiving the transmitted message at the second (receiving) wireless communication device 204, whereby the redundancy enables correction for bit errors that may occur due to the noise 208 imparted on the transmitted message. That is, a decoder 214 at the second (receiving) wireless communication device 204 can take advantage of the redundancy to reliably recover the information message provided to an information sink 216 even though bit errors may occur, in part, due to the addition of the 208 noise to the channel 206.

Many examples of such error correcting block codes are known to those of ordinary skill in the art, including Hamming codes, Bose-Chaudhuri-Hocquenghem (BCH) codes, and turbo codes, among others. Some existing wireless communication networks utilize such block codes. For example, 3GPP LTE networks may use turbo codes. However, for future networks, a new category of block codes, called Polar codes, presents a potential opportunity for reliable and efficient information transfer with improved performance relative to other codes.

Polar codes are linear block error correcting codes where channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise. This capacity can be achieved with a simple successive cancellation (SC) decoder.

Polar codes may be considered as block codes (N, K). While it would be flexible for the encoder 212 to be able to select the number of information bits K, with polar codes, the codeword length N is a power-of-two (e.g., 256, 512, 1024, etc.) because the original construction of a polarizing matrix is based on the Kronecker product of $$\begin{bmatrix} 1 & 0 \\ 1 & 1 \end{bmatrix}.$$

The disclosure relates in some aspects, to puncturing and repetition for Polar codes. As used herein, the term puncturing may refer to, for example, reducing the size of a block by omitting (e.g., eliminating) some of the bits of the original block, while the term repetition may refer to, for example, increasing the size of a block by repeating (e.g., adding) some of the bits of the original block.

To generate encoded data for a first transmission, the encoder 212 generates encoded data 218 (e.g., a codeword). The encoder 212 then determines a puncture pattern or repetition pattern, respectively, depending on whether the encoded data 218 is to be punctured or repeated. As discussed in more detail below, the determination of which bits to puncture or repeat may depend in some aspects on dividing the bits into tuples and selecting only one bit from a given tuple. This results in a specific puncture pattern or repetition pattern, according to the particular operation being performed. To this end, the encoder 212 includes a module for determining a puncture or repetition pattern by selecting one bit from each tuple 220. A module for puncturing or repeating encoded data 222 punctures or repeats the encoded data 218 using the determined puncture pattern or repetition pattern, respectively. The first wireless communication device 202 then transmits the resulting data (e.g., codeword). As used herein, the term tuple refers to a set of two or more elements. Thus, a bit tuple refers to a set of two or more bits (e.g., a bit pair).

Upon receiving the punctured or repeated encoded data 226 at the second wireless communication device 204, a module for decoding 224 decodes the data 226. For example, the decoder 214 may use decoding such as SC decoding or some other suitable type of decoding.

The teachings herein may be used to improve the encoding performance of an encoder or some other type of other processing circuit (e.g., a processor) that performs encoding. For example, an encoder that uses puncturing and/or repetition generated as taught herein may provide more reliable encoding as compared to an encoder that uses some other puncturing scheme and/or repetition scheme. This higher reliability may be achieved, for example, by sending information over the bits with the lowest erasure probabilities. Thus, fewer retransmissions may be needed by using puncturing and/or repetition as taught herein is used instead of other puncturing and repetition schemes that do not encode information in this manner.

In some implementations, the encoder 212 may include or use an input interface 228 and/or an output interface 230. Such an interface may include, for example, an interface bus, bus drivers, bus receivers, radio frequency (RF) circuitry, other suitable circuitry, or a combination thereof. For example, the input interface 228 may include receiver devices, buffers, an RF receiver, or other circuitry for receiving a signal. As another example, the output interface 230 may include output devices, drivers, an RF transmitter, or other circuitry for sending a signal. In some implementations, these interfaces may be configured to interface with one or more other components of the encoder 212.

Polar Codes

Polar codes will now be discussed in more detail with reference to FIGS. 3 and 4. Referring initially to the top of FIG. 3, a binary-input discrete memoryless channel 302 may be represented as W: X→Y, where X is an input and Y is an output of a channel W. The capacity C of this channel is: C=I(X;Y), where I represents the mutual information function.

Referring to the bottom of FIG. 3, an effective channel $W_{VEC}$ 308 for multiple inputs may be represented as follows. For the example of a binary-input, 0≤C≤1, a transformation may include the following operations. Starting with N copies of the channel W 302; a one-to-one mapping $G_{N \times N}$ 310 is applied from U inputs ($U_0, U_1, \ldots, U_N$) to X outputs ($X_0, X_1, \ldots, X_N$) as set forth in Equation 1 of Table 1. The effective channel $W_{VEC}$ 308 is thus created, with $X^N = U^N \cdot G_{N \times N}$. For the relatively simple case of N=2, $G_{N \times N}$ may be represented as set forth in Equation 2 of Table 1.

TABLE 1

| | |
|---|---|
| $X^N = U^N \cdot G_{N \times N}$, where $G_{N \times N} = \{0, 1\}^N \to \{0, 1\}^N$. | EQUATION 1 |
| $G_{2 \times 2} = \begin{bmatrix} 1 & 0 \\ 1 & 1 \end{bmatrix}$ | EQUATION 2 |
| $U_0 = X_0 \oplus X_1 = Y_{01} \oplus Y_1$ (corresponding to a parity-check) $U_1 = X_1 = X_0 \oplus U_0$ (corresponding to repetition) | EQUATION 3 |
| $\varepsilon^- = 1 - (1 - \varepsilon)^2 = 2\varepsilon - \varepsilon^2$ | EQUATION 4 |
| $\varepsilon^+ = \varepsilon^2$. | EQUATION 5 |

Figure 4:
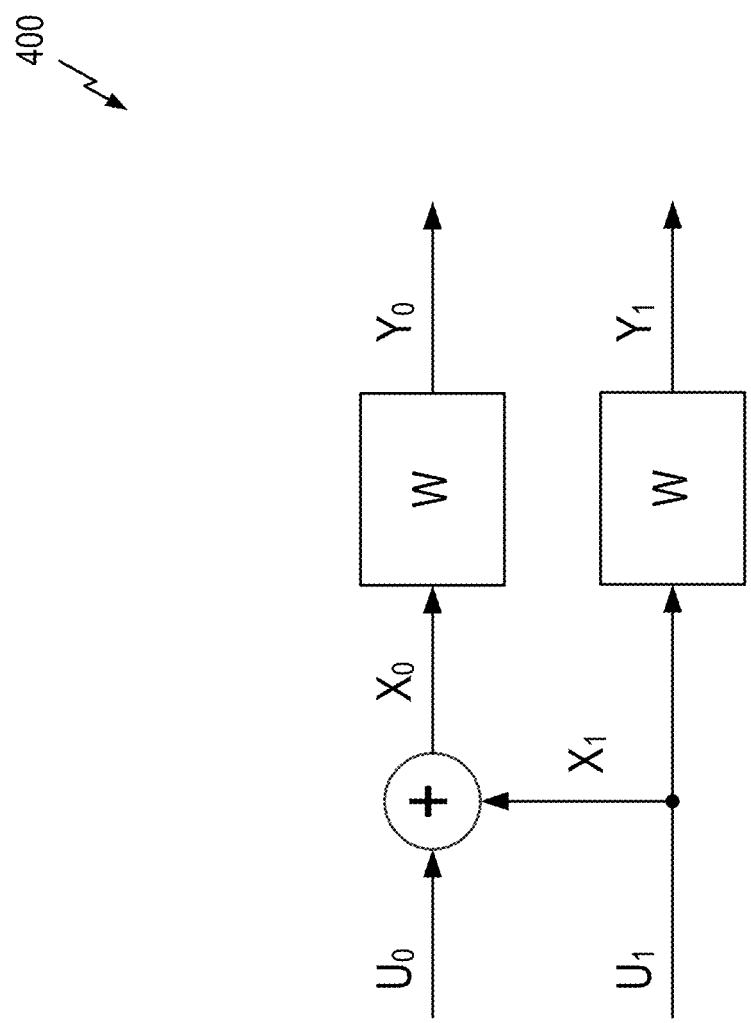
FIG. 4 is a diagram of an example of polarization for Polar codes.

Assuming W is a binary erasure channel (BEC) with an erasure probability 'ε', the relationships set forth in Equation 3 of Table 1 are true (with reference to the schematic 400 of FIG. 4). In FIG. 4, $U_0$ is an input and $Y_0$ is an output for a channel $W_0$. Similarly, $U_1$ is an input and $Y_1$ is an output for a channel $W_1$.

For the channel $W_0$: $U_0 \to Y^N$, the erasure probability ($\varepsilon^-$) is set forth in Equation 4 of Table 1. For the channel $W_1$: $U_1 \to (Y^N, U_0)$, the erasure probability ($\varepsilon^+$) is set forth in Equation 5 of Table 1. In view of the above, $W_1$ is a better channel than $W_0$. Accordingly, $U_1$ will have a higher reliability than $U_0$ under SC decoding. The above operation can be performed recursively, yielding more polarization across N.

Polar codes have the constraint that the mother code has a length N=2L for some L. In practice, codes may be rate-compatible. For example, coded bits may be punctured to meet the constraint of allocation.

Alternatively, coded bits may be repeated to meet the constraint of the allocation. For example, start with a fixed N and repeat to meet the allocation size. The encoder/decoder complexity may be lower in this case as compared with starting from 2N and puncturing.

The disclosure relates in some aspects to attempting to find the best scheme to puncture/repeat given a base polar code. The foregoing analysis uses BEC as an example, where density evolution is more tractable to predict performance. However, the teachings herein are applicable to any channel model.

Encoder Structure

Figure 5:
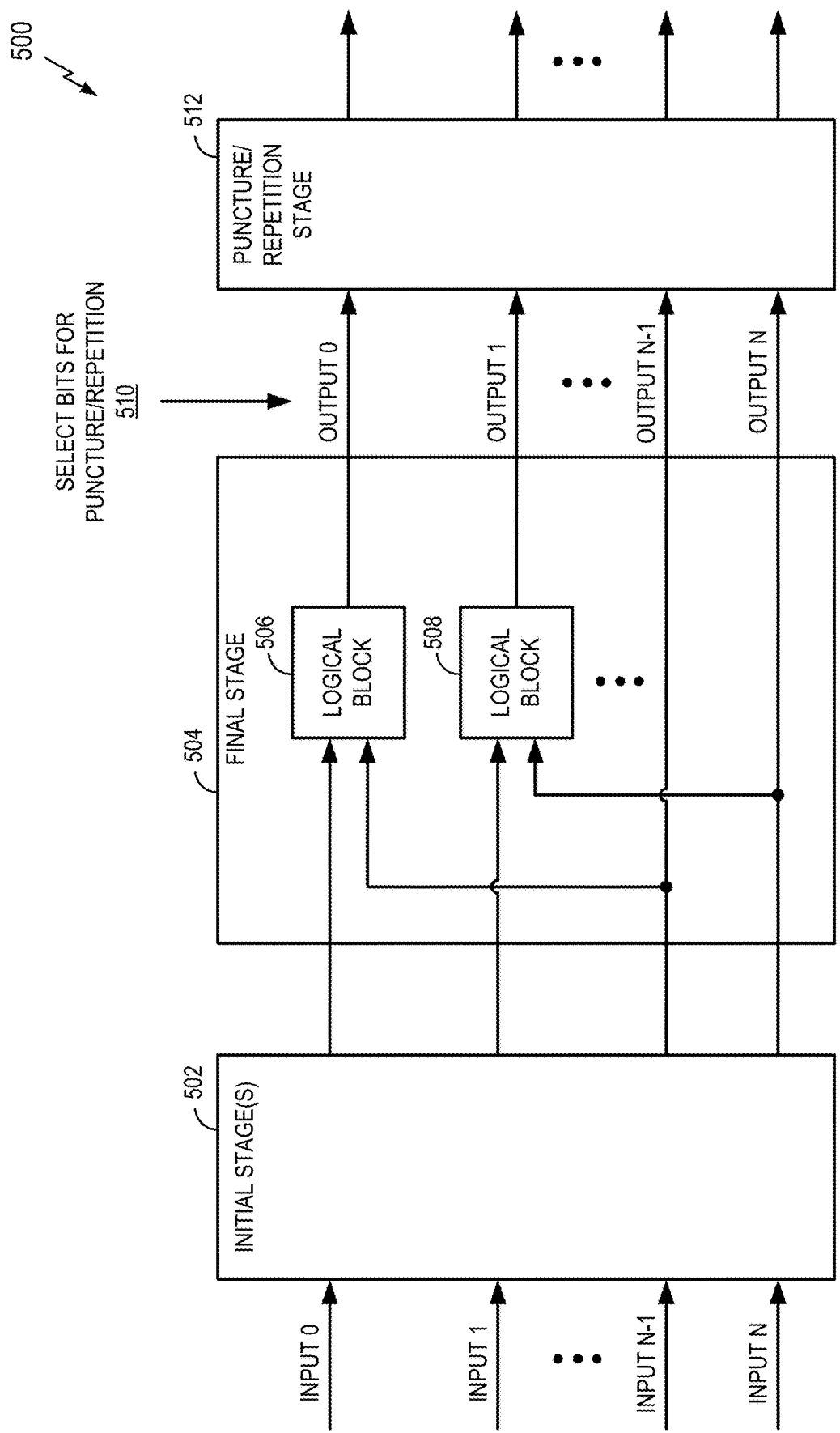
FIG. 5 is a block diagram of an example encoder structure in accordance with some aspects of the disclosure.

FIG. 5 illustrates a high-level example of an encoder structure 500 where bits for puncture or repetition may be selected in accordance with the teachings herein. Input bits are operated on by an initial stage (or stages) 502 and a final stage 504 of the encoder structure to provide a set of output bits.

As shown in FIG. 5, the final stage 504 includes several logical blocks (e.g., XORs). To reduce the complexity of FIG. 5, only two logical blocks 506 and 508 are shown. It should be appreciated that the final stage 504 may include more logical blocks.

In accordance with the teachings herein, certain bits of the output bits are selected 510 to be punctured or repeated by a puncture puncture/repetition stage 512. For example, selection of a bit tuple that consist of an input and an output of the same logical block may be avoided. As discussed in more detail below, this selection may result in improved performance of the encoding.

Puncturing

An example puncturing scheme will be discussed in more detail with reference to FIGS. 6-13. FIGS. 6-13 illustrate several examples of encoders 600-1300 for generating puncture patterns where bits to be punctured do not include an input and an output of the same logical block in accordance with the teachings herein. In these figures, the number of bits N=8, the number of puncture bits P=3, and the number of information bits to be encoded K=3. Other values may be used in other scenarios. The values shown in these figures indicate the erasure probability of the corresponding bit. The erasure probabilities may have different values in different scenarios.

Figure 8:
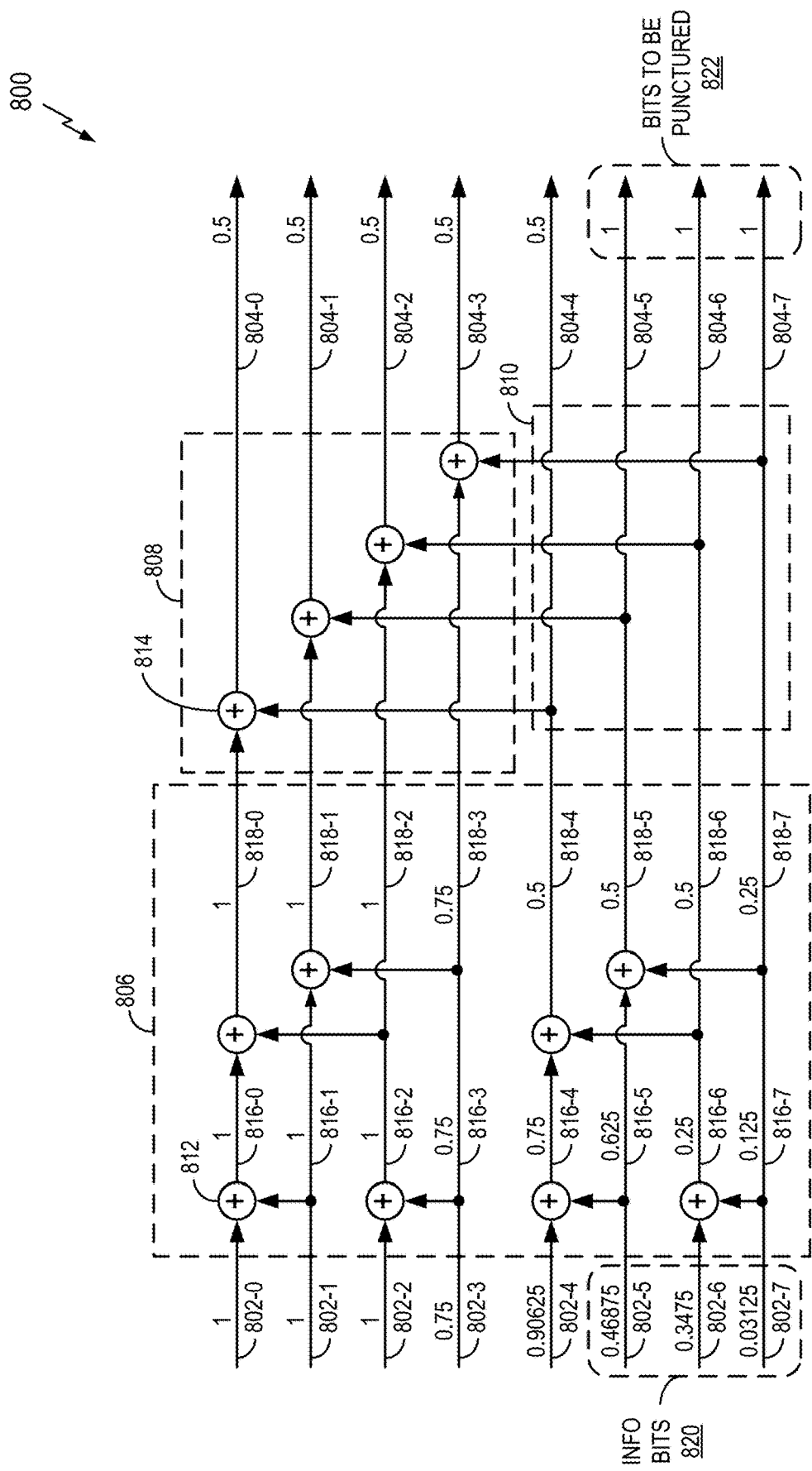
FIG. 8 is a schematic diagram of a third example puncturing technique for Polar codes in accordance with some aspects of the disclosure.

Step 1: Puncturing: Take a non-bit-reversed polar code construction. Assume P out of N output bits are to be punctured. One of the better puncturing schemes is to pick the top-P consecutive encoded bits and puncture (FIG. 6) or the bottom-P consecutive encoded bits and puncture (FIG. 8). These are equivalent methods from, for example, an erasure probability perspective.

Step 2: Freezing bits: Given K (# of information bits to be encoded) is <N, some of the information bits are to be frozen. In some implementations, the frozen bits can be selected based on density evolution subject to the puncturing pattern described herein. Alternatively, a defined (e.g., predefined) frozen bit sequence (e.g., that might be sub-optimal) could be used. Similar frozen bit techniques could be used for repetition as well.

Once the above is done, the erasure probability for each bit may be calculated (e.g., the numbers 1, 0.75, 0.5, etc., above the data paths (information paths) as shown in FIGS. 6-13) and the information bits are sent over the bits with the lowest erasure probabilities.

In FIGS. 6-13, each encoder 600-1300 includes inputs bits (e.g., bits 602-0 to 602-7 in FIG. 6) and output bits (e.g., bits 604-0 to 604-7 in FIG. 6) associated with corresponding error probabilities. Each encoder also includes an input stage, and a final stage that includes an XOR group (e.g., XOR group 608 in FIG. 6) and repetition paths (e.g., paths 610 in FIG. 6). XORs are represented by a standard XOR symbols (e.g., the XOR 612 and the XOR 614 in FIG. 6). Additional error probabilities are shown of intermediate stages of the encoders as well (e.g., paths 616-0 to 616-7 and paths 618-0 to 618-7 in FIG. 6). FIGS. 7-13 illustrate similar structure as FIG. 6 with like features indicated by similar numbering.

As mentioned above, FIG. 6 shown an example of top puncturing (i.e., puncturing bits from the top half of the output bits). Each of the XORs of the XOR group 608 correspond to the XOR of FIG. 4 (e.g., the parity-check path $U_0$ of the Polar encoding function). In addition, each of the four paths 610 below the XOR group 608 correspond to the repetition path $U_1$ of FIG. 3. Accordingly, each XOR in the XOR group 608 has an output and what is referred to herein as a repetition input (corresponding to the structure of FIG. 4). For example, the XOR 614 has an output bit 604-0 and a repetition input bit 604-4. In some aspects, the XOR group 608 may be referred to as the last stage of the encoder graph.

Of note, the punctured bits 622 (output bits 604-0, 604-1, and 604-2) do not include both the output and the repetition input of any of the four XORs of the XOR group 608. For example, the output bit of the XOR 614 (the output bit 604-0) is punctured, but the repetition input of the XOR 614 (the output bit 604-4) is not punctured. If both the output and the repetition input to one of these XORs was punctured, the performance (e.g., reliability) of the encoding/decoding would generally be worse. However, if only one of the output and the repetition input of one of these XORs is punctured, the output of the XOR will be an erasure but the output of the repetition path (corresponding to the repetition input) will not be punctured. Thus, the performance is better in this scenario.

The puncture pattern examples of FIGS. 7-13 will now be described.

Figure 6:
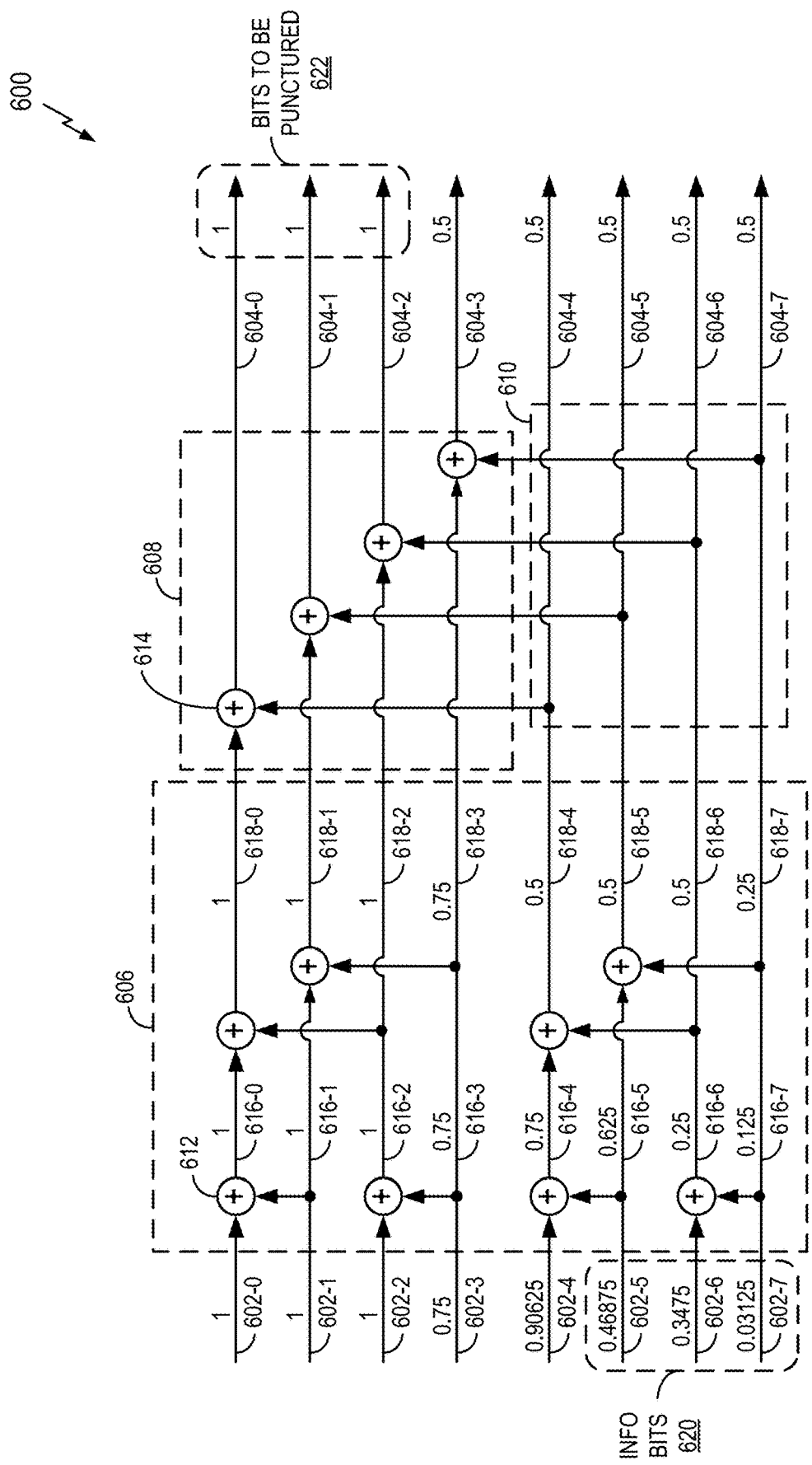
FIG. 6 is a schematic diagram of a first example puncturing technique for Polar codes in accordance with some aspects of the disclosure.
Figure 7:
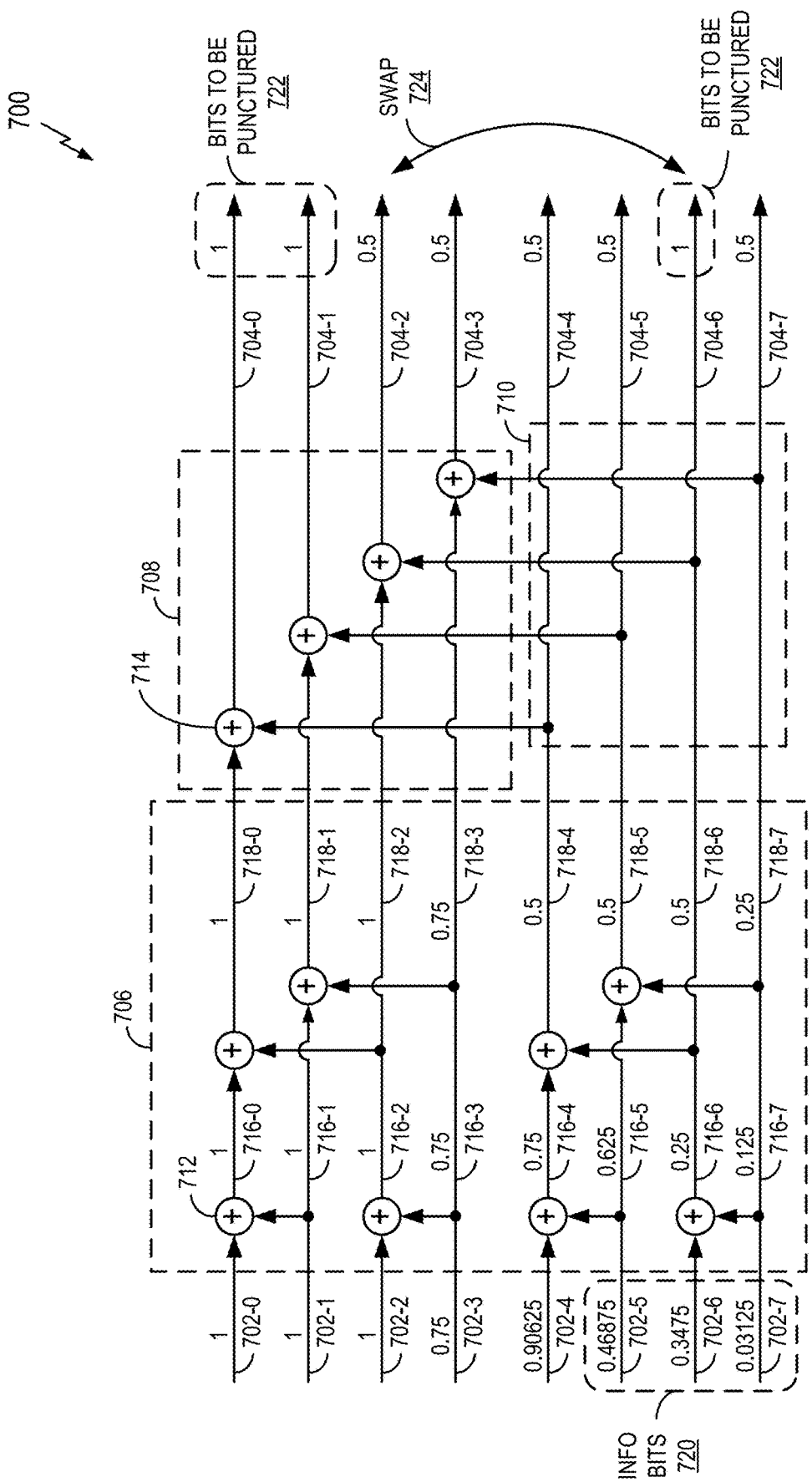
FIG. 7 is a schematic diagram of a second example puncturing technique for Polar codes in accordance with some aspects of the disclosure.

Puncture can be split between the top (beginning) half and the bottom (end) half of the output bits as shown for the encoder 700 in FIG. 7. In this example, the bits to be punctured 722 include outputs bits 704-0, 704-1, and 704-6. The bit swap 724 of FIG. 7 is relative to FIG. 6. Specifically, the output bit 704-6 is punctured instead of the output bit 704-2 (contrast FIG. 6 where the punctured bits 622 include the output bit 604-2). In accordance with the teachings herein, the punctured bits 722 do not include both the output and the repetition input of any of the four XORs of the XOR group 708.

As mentioned above, FIG. 8 illustrates the erasure probability equivalence between bottom-puncturing (i.e., puncturing bits from the bottom half of the output bits) and the top-puncturing of FIG. 6. The encoder 800 shows an example of bottom-puncturing where the bits to be punctured 822 include outputs bits 804-5, 804-6, and 804-7, all of which are from the bottom half of the output bits. This is in contrast with FIG. 6 where all of the punctured bits 622 are from the top half of the output bits. In accordance with the teachings herein, the punctured bits 822 do not include both the output and the repetition input of any of the four XORs of the XOR group 808.

Figure 9:
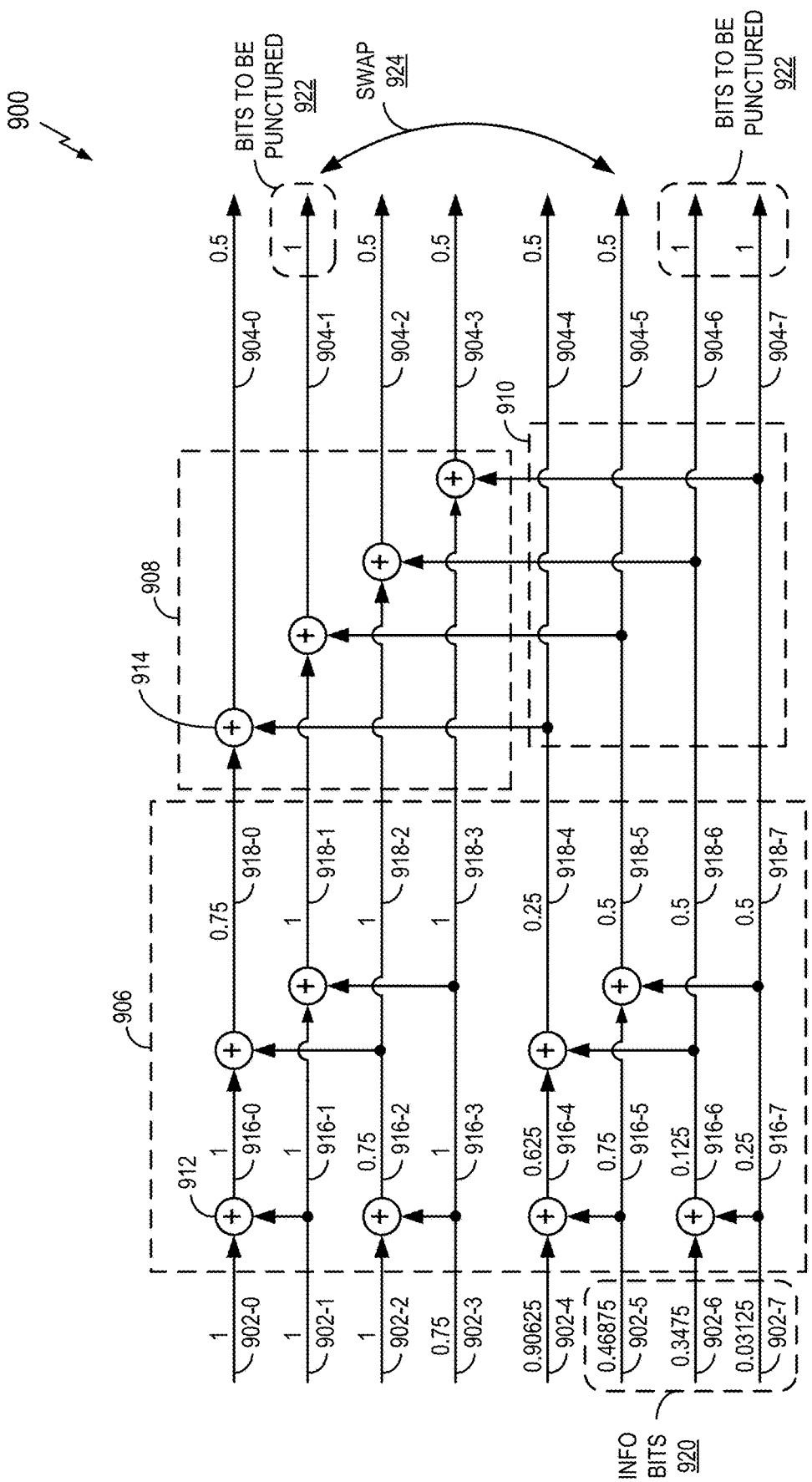
FIG. 9 is a schematic diagram of a fourth example puncturing technique for Polar codes in accordance with some aspects of the disclosure.

Similar to FIG. 7, the encoder 900 of FIG. 9 shows another way that puncture bits can be split between the top (beginning) half and the bottom (end) half of the output bits. In this example, the bits to be punctured 922 include outputs bits 904-1, 904-6, and 904-7. The bit swap 924 of FIG. 9 is relative to FIG. 8. Specifically, the output bit 904-1 is punctured instead of the output bit 904-5 (contrast FIG. 8 where the punctured bits 822 include the output bit 804-5). In accordance with the teachings herein, the punctured bits 922 do not include both the output and the repetition input of any of the four XORs of the XOR group 908.

Figure 10:
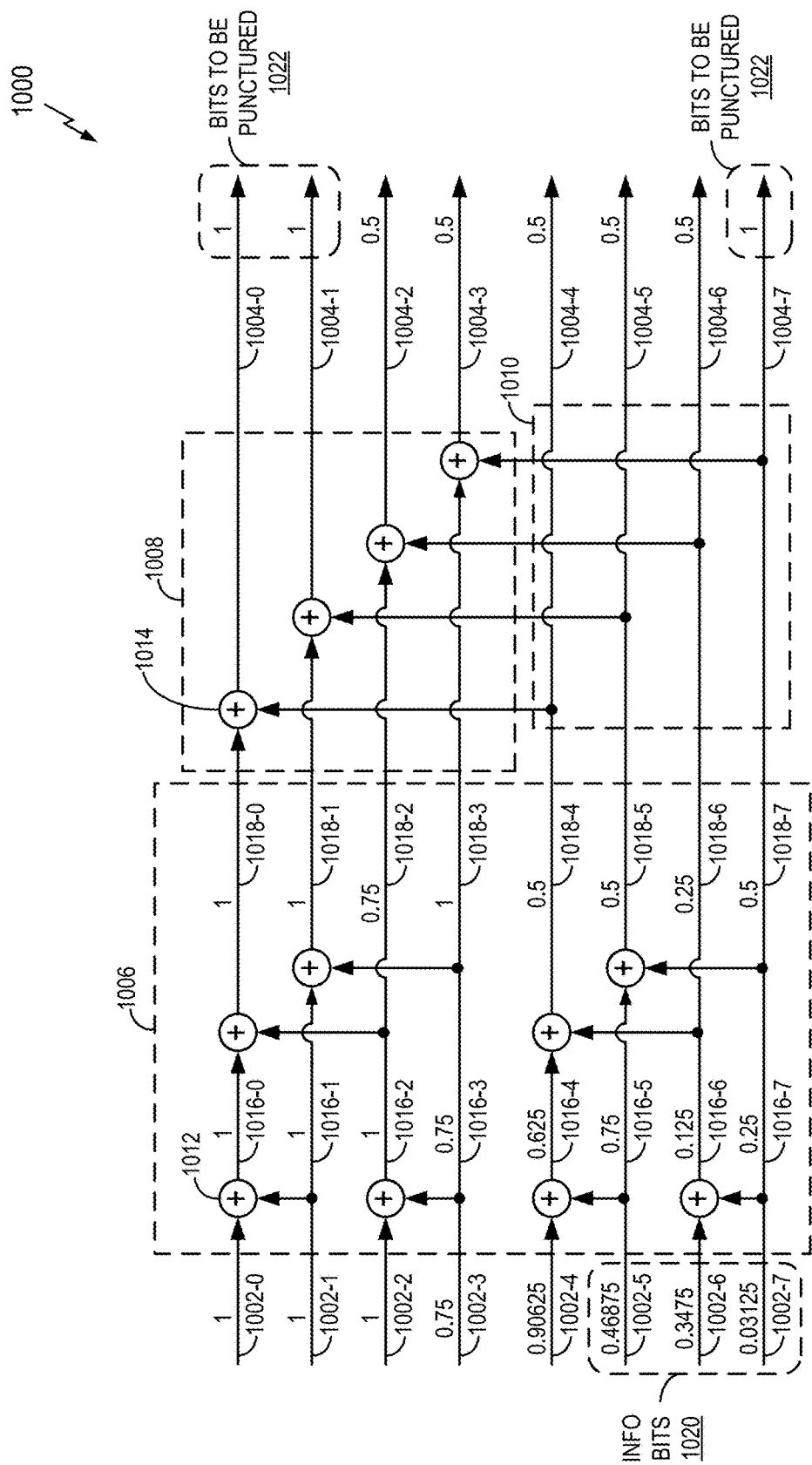
FIG. 10 is a schematic diagram of a fifth example puncturing technique for Polar codes in accordance with some aspects of the disclosure.

The encoder 1000 of FIG. 10 illustrates another way to split the bits for puncturing to achieve the same erasure probability results as the encoders 600-900. In this case, the puncture split is between the top (beginning) and the bottom (end) of the output bits. Specifically, the bits to be punctured 1022 include outputs bits 1004-0, 1004-1, and 1004-7. In accordance with the teachings herein, the punctured bits 1022 do not include both the output and the repetition input of any of the four XORs of the XOR group 1008.

Figure 11:
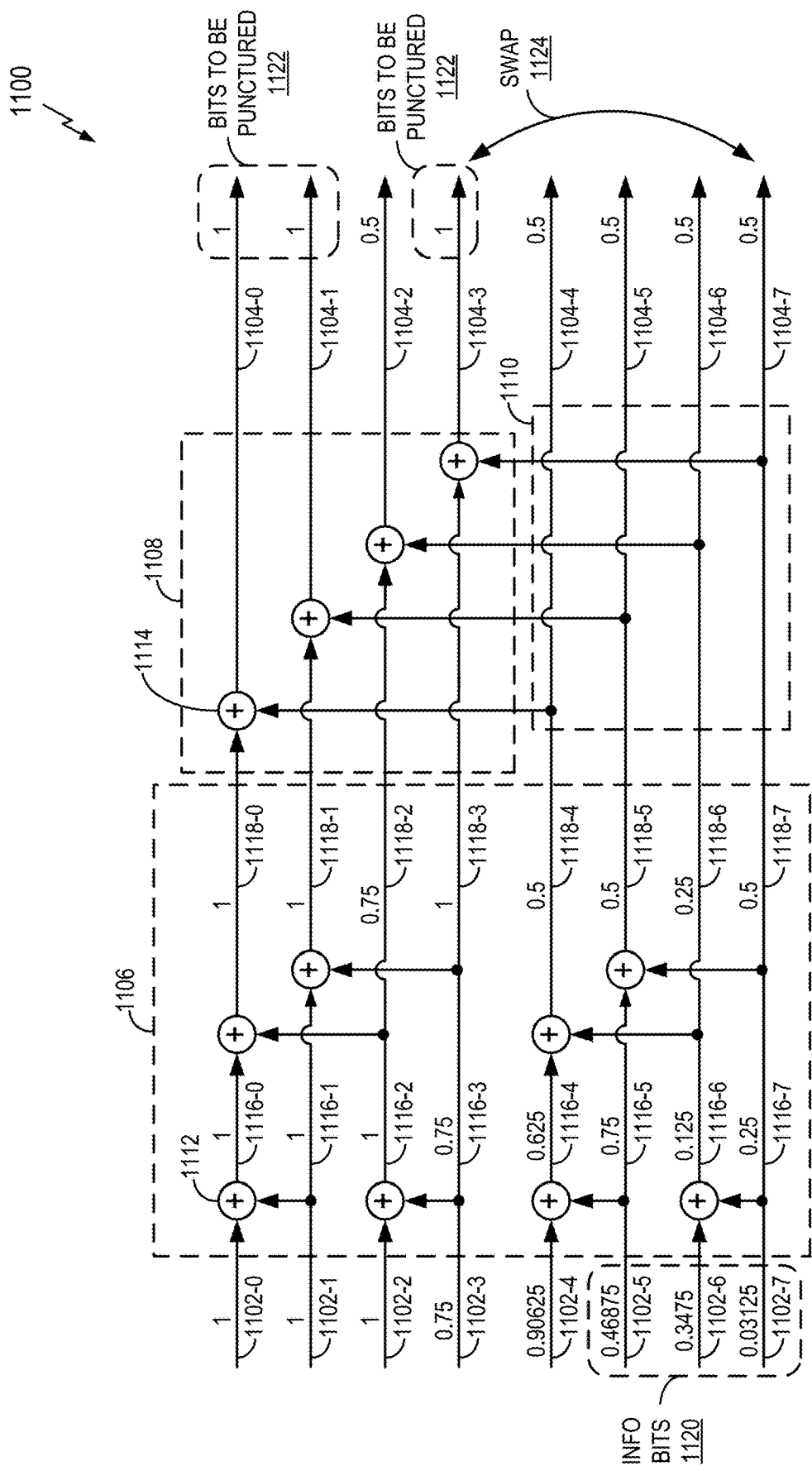
FIG. 11 is a schematic diagram of a sixth example puncturing technique for Polar codes in accordance with some aspects of the disclosure.

FIG. 11 shows another example of top-puncturing achieved with a bit swap 1124 relative to FIG. 10. Specifically, the output bit 1104-3 is punctured instead of the output bit 1104-7 (contrast FIG. 10 where the punctured bits 1022 include the output bit 1004-7). In accordance with the teachings herein, the punctured bits 1122 do not include both the output and the repetition input of any of the four XORs of the XOR group 1108.

Figure 12:
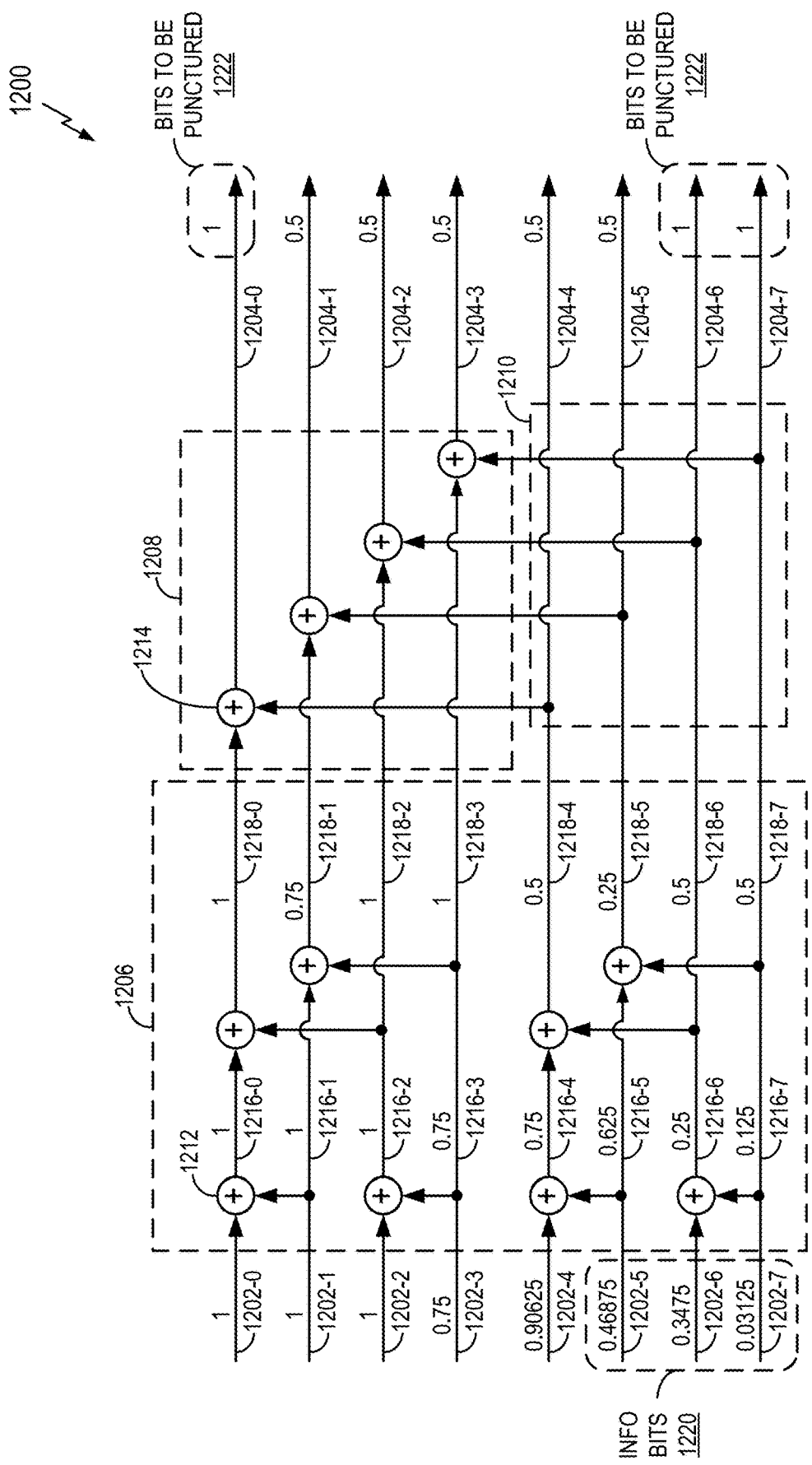
FIG. 12 is a schematic diagram of a seventh example puncturing technique for Polar codes in accordance with some aspects of the disclosure.

The encoder 1200 of FIG. 12 illustrates another way to split the punctured bits to achieve the same erasure probability results as the encoders 600-1100. The bits to be punctured 1222 include outputs bits 1204-0, 1204-6, and 1204-7. In accordance with the teachings herein, the punctured bits 1222 do not include both the output and the repetition input of any of the four XORs of the XOR group 1208.

Figure 13:
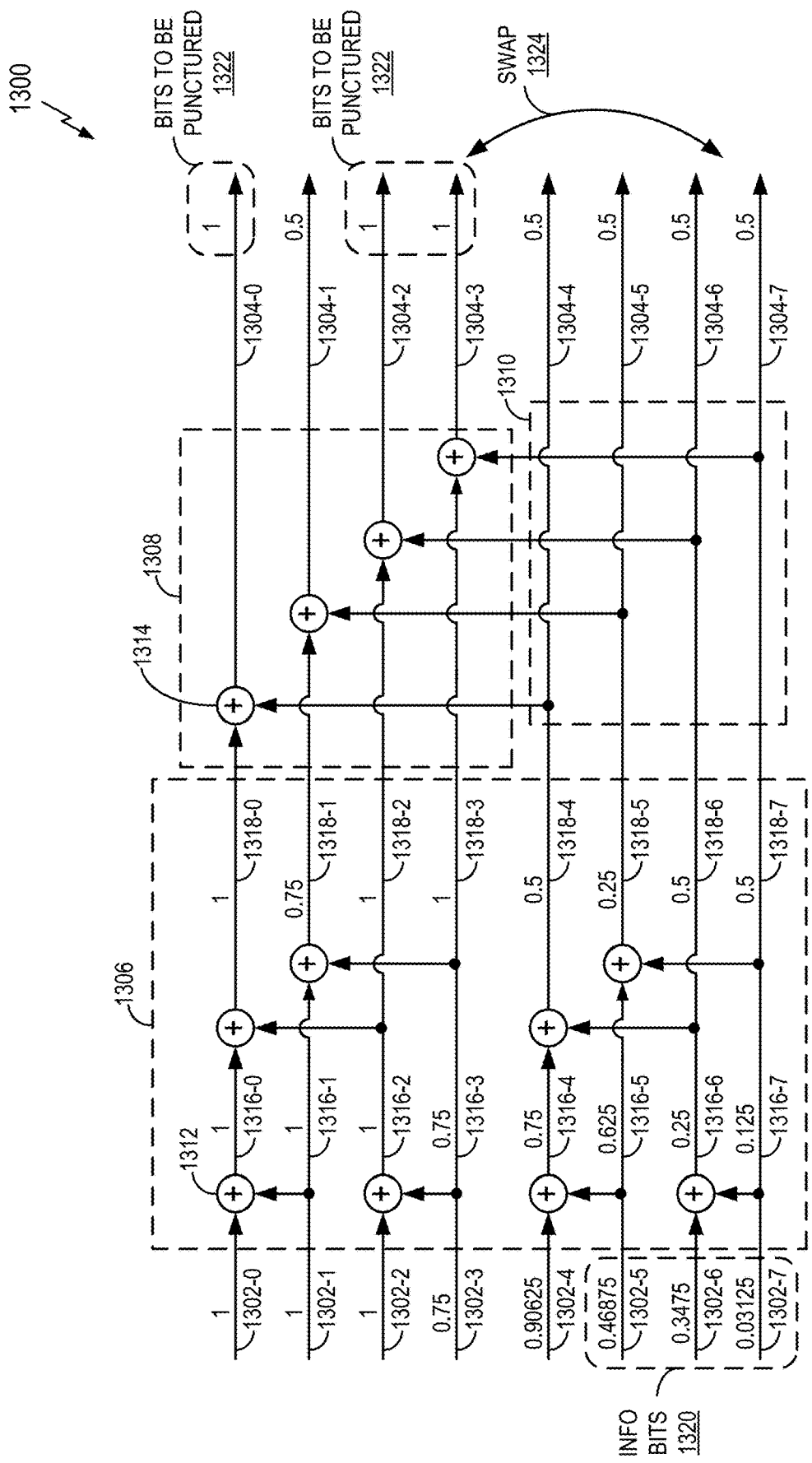
FIG. 13 is a schematic diagram of an eighth example puncturing technique for Polar codes in accordance with some aspects of the disclosure.

FIG. 13 shows another example of top-puncturing achieved with a bit swap 1324 relative to FIG. 12. Here, the output bits 1304-2 and 1304-3 are punctured instead of the output bits 1304-6 and 1304-7 (contrast FIG. 12 where the punctured bits 1222 include the output bits 1204-6 and 1204-7). In accordance with the teachings herein, the punctured bits 1322 do not include both the output and the repetition input of any of the four XORs of the XOR group 1308.

From the above, it may be seen that all of the configurations achieve the same erasure probability results. Of note, in each configuration, the punctured bits do not include both the output and the repetition input of an XOR of any of the XORs of the XOR group 402 (e.g., the parity-check XOR group). The actual configuration selected may depend on various criteria. For example, it may be easier to use contiguous bits. As another example (e.g., an OFDM scenario), some of the bits may be subjected to channel fading. Thus, these bits may be better candidates for puncture. It should be appreciated that other configurations (e.g., with a different number of punctured bits, a different number of output bits, different bit splitting, different bit grouping, etc.) may be used in accordance with the teachings herein.

The following schemes illustrate examples of how to pick indexes of encoded bits of polar code (length-N) for puncturing P positions.

Scheme 1 (from-begin): Puncture-set=pick one from each of the tuples (0, N/2), (1, N/2+1), . . . , (i, N/2+i), . . . , (P−1, N/2+P−1).

Scheme 2 (from-end): Puncture-set=pick one from each of the tuples (N/2−1, N−1), (N/2−2, N−2), . . . , (N/2−i, N−i), . . . , (N/2−P, N−P).

Scheme 3 (mixture of from-begin, from-end): For a given m: m∈{0, P−1}, define j=P−m; Set1=Pick from one from each of the tuples (0, N/2), (1, N/2+1), . . . , (m, N/2+m); Set2=Pick from one from each of the tuples (N/2−1, N−1), (N/2−2, N−2), . . . , (N/2−j, N−j); The puncture-set=Set1+Set2.

Repetition

An example repetition scheme will be discussed in more detail with reference to FIGS. 14-17. FIGS. 14-17 illustrate several examples of encoders 1400-1700 for generating repetition patterns where bits to be repeated do not include an input and an output of the same logical block in accordance with the teachings herein. In these figures, the number of bits N=8, the number of repetition bits P=3, and the number of information bits to be encoded K=3. Other values may be used in other scenarios. The values shown in these figures indicate the erasure probability of the corresponding bit. The erasure probabilities may have different values in different scenarios.

The following schemes illustrate examples of how to pick indexes of encoded bits of polar code (length-N) for repeating P positions. In some aspects, the same criterion is used for selecting the indexes for repetition as was used for selecting the indexes for puncturing. Namely, the repeated bits do not include the output and the repetition input of any of the XORs of the parity-check XOR group. If both the output and the repetition input of one of these XORs was repeated, the performance (e.g., reliability) gain of the encoding/decoding would not be as significant. However, if at most one of the output and the repetition input of these XORs is repeated, the performance gain may be higher.

Scheme 1 (from-begin): Repeat-set=pick one from each of the tuples (0, N/2), (1, N/2+1), . . . , (i, N/2+i), . . . , (R−1, N/2+R−1).

Scheme 2 (from-end): Repeat-set=pick one from each of the tuples (N/2−1, N−1), (N/2−2, N−2), . . . , (N/2−i, N−i), . . . , (N/2−R, N−R).

Scheme 3 (mixture of from-begin, from-end): For a given m: m∈{0, R−1}, define j=R−m; Set1=Pick one from each of the tuples (0, N/2), (1, N/2+1), . . . , (m, N/2+m); Set2=Pick one from each of the tuples (N/2−1, N−1), (N/2−2, N−2), . . . , (N/2−j, N−j); The repeat-set=Set1+Set2.

Figure 14:
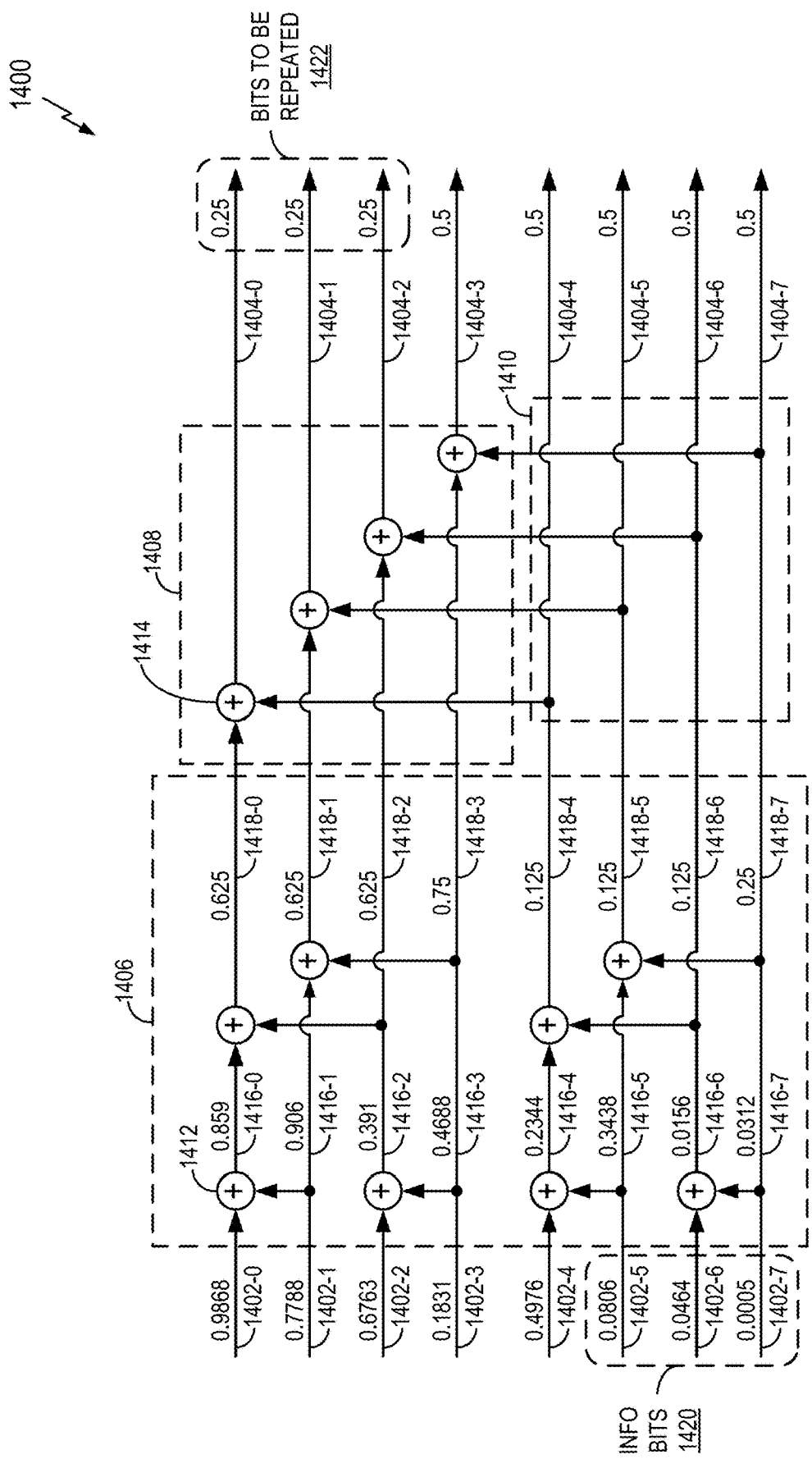
FIG. 14 is a schematic diagram of a first example repetition technique for Polar codes in accordance with some aspects of the disclosure.
Figure 15:
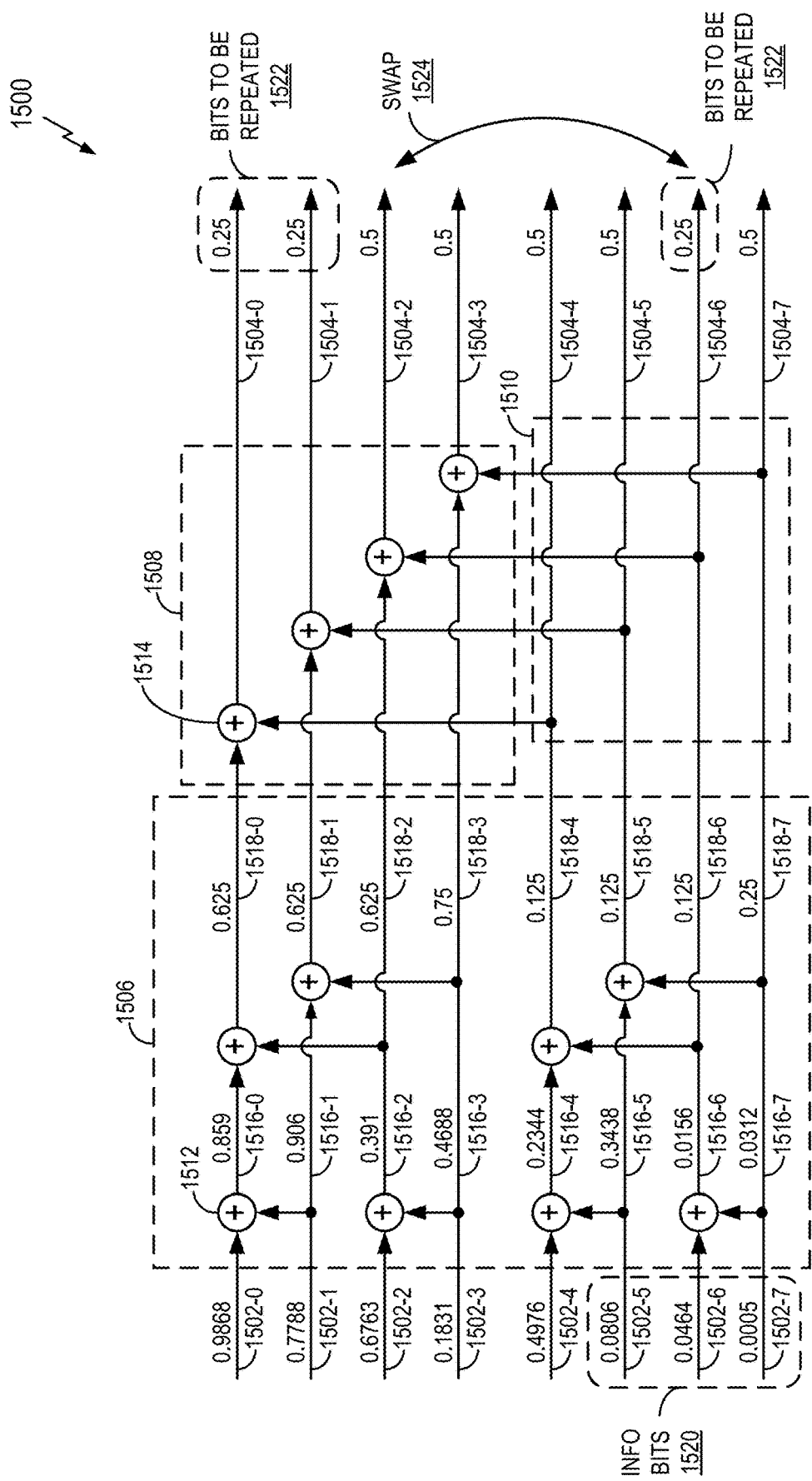
FIG. 15 is a schematic diagram of a second example repetition technique for Polar codes in accordance with some aspects of the disclosure.
Figure 16:
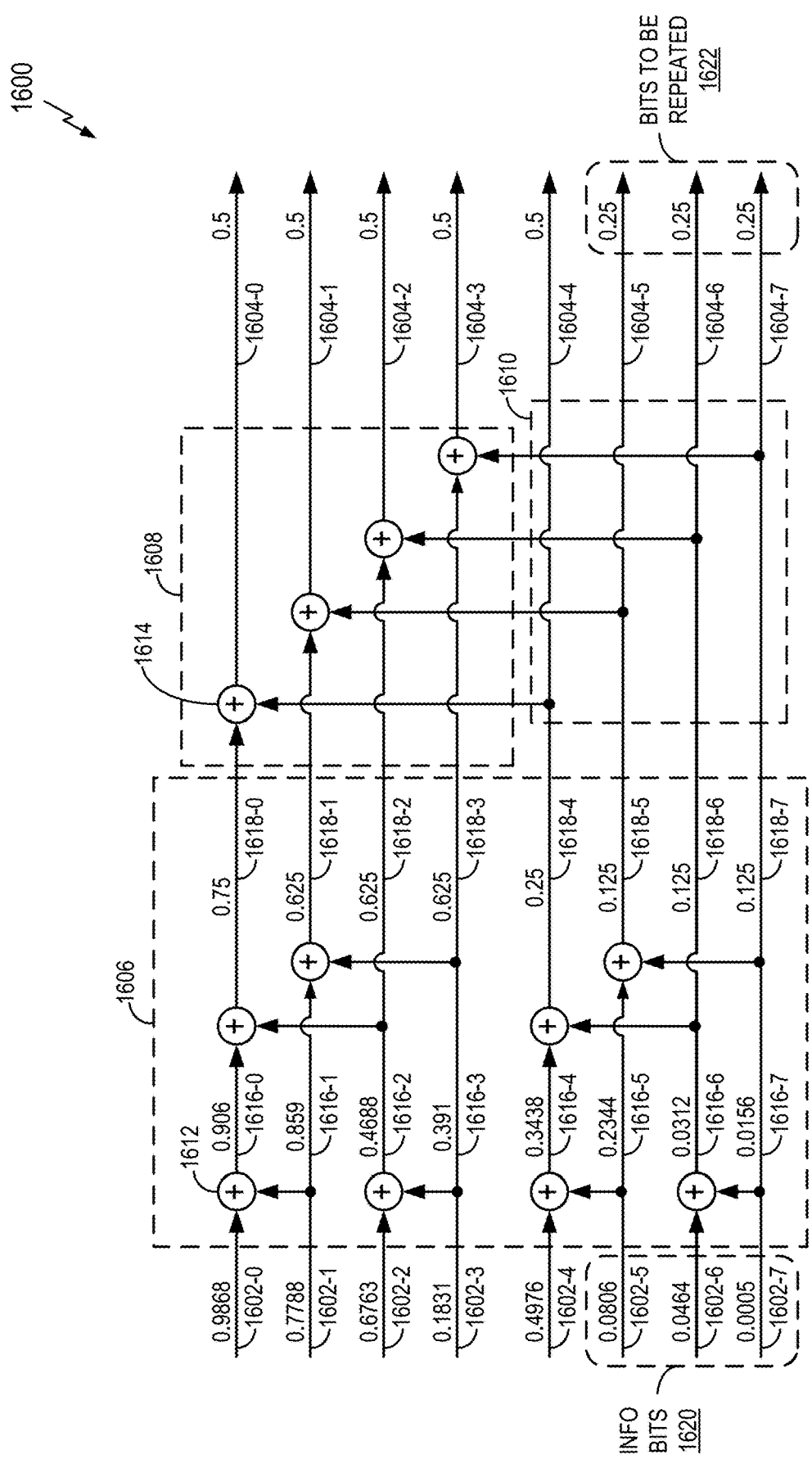
FIG. 16 is a schematic diagram of a third example repetition technique for Polar codes in accordance with some aspects of the disclosure.
Figure 17:
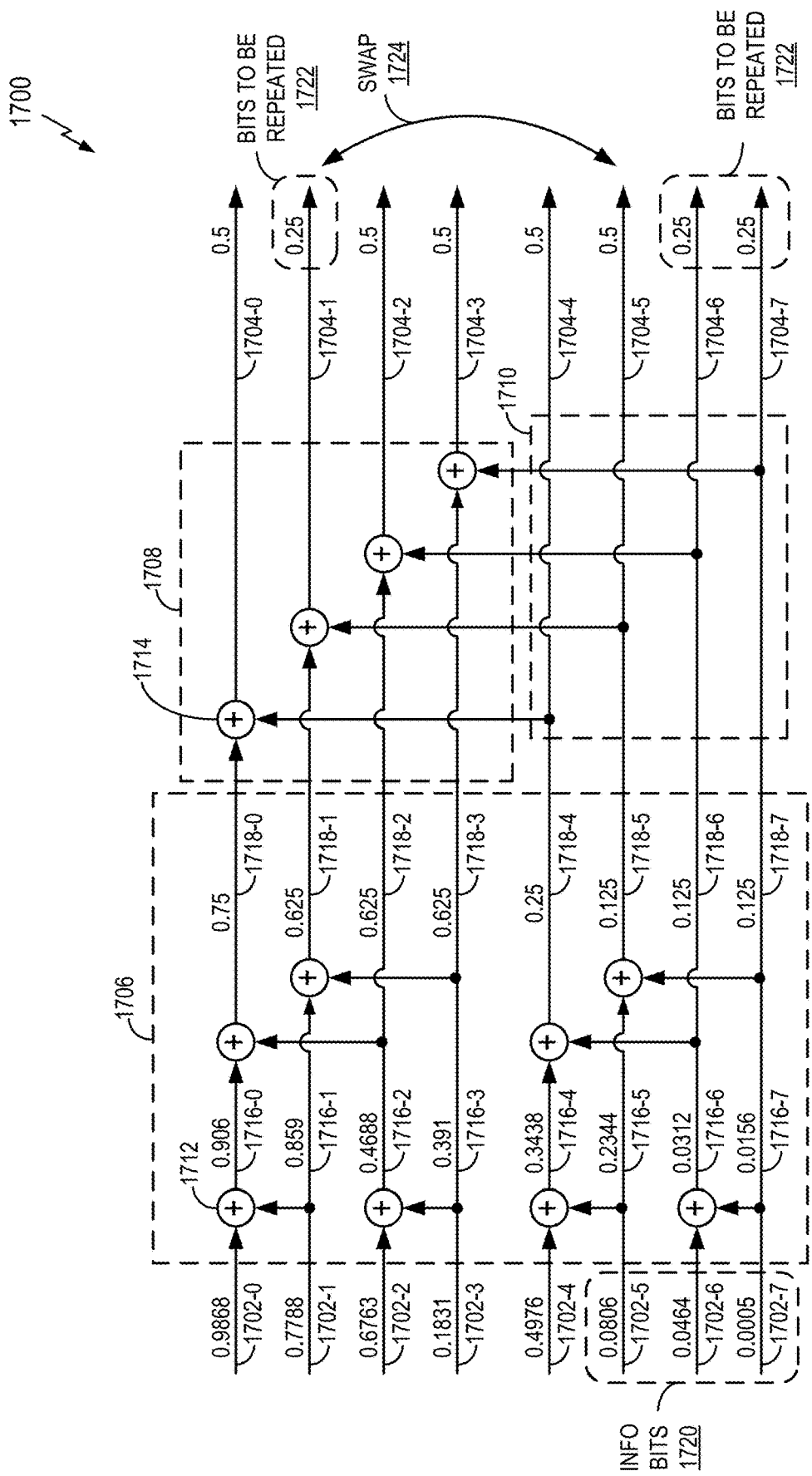
FIG. 17 is a schematic diagram of a fourth example repetition technique for Polar codes in accordance with some aspects of the disclosure.

In FIGS. 14-17, each encoder 1400-1700 includes inputs bits (e.g., bits 1402-0 to 1402-7 in FIG. 14) and output bits (e.g., bits 1404-0 to 1404-7 in FIG. 14) associated with corresponding error probabilities (e.g., the numbers 1, 0.75, 0.5, etc., above the data paths (information paths)). Each encoder also includes an input stage, and a final stage that includes an XOR group (e.g., XOR group 1408 in FIG. 14) and repetition paths (e.g., paths 1410 in FIG. 14). XORs are represented by a standard XOR symbols (e.g., the XOR 1412 and the XOR 1414 in FIG. 14). Additional error probabilities are shown of intermediate stages of the encoders as well (e.g., paths 1416-0 to 1416-7 and paths 1418-0 to 1418-7 in FIG. 14). FIGS. 15-17 illustrate similar structure as FIG. 14 with like features indicated by similar numbering. In general, any of the structures of FIGS. 6-13 may be applicable to repetition as well.

FIG. 14 shown an example of top repeating (i.e., repeating bits from the top half of the output bits). Of note, the repeated bits 1422 (output bits 1404-0, 1404-1, and 1404-2) do not include both the output and the repetition input of any of the XORs of the XOR group 1408. For example, the output bit of the XOR 1414 (the output bit 1404-0) is repeated, but the repetition input of the XOR 1414 (the output bit 1404-4) is not repeated. Also note that the XORs of the XOR group 1408 correspond to the XOR of FIG. 4 (e.g., the parity-check path of the Polar encoding graph).

Repetition can be split between the top (beginning) half and the bottom (end) half of the output bits as shown for the encoder 1500 in FIG. 15. In this example, the bits to be repeated 1522 include outputs bits 1504-0, 1504-1, and 1504-6. The bit swap 1524 of FIG. 15 is relative to FIG. 14. Specifically, the output bit 1504-6 is repeated instead of the output bit 1504-2 (contrast FIG. 14 where the repeated bits 1422 include the output bit 1404-2). In accordance with the teachings herein, the repeated bits 1522 do not include both the output and the repetition input of any of the four XORs of the XOR group 1508.

FIG. 16 illustrates the erasure probability equivalence between bottom-repeating (i.e., repeating bits from the bottom half of the output bits) and the top-repeating of FIG. 14. The encoder 1600 shows an example of bottom-repeating where the bits to be repeated 1622 include outputs bits 1604-5, 1604-6, and 1604-7, all of which are from the bottom half of the output bits. This is in contrast with FIG. 14 where all of the repeated bits 1422 are from the top half of the output bits. In accordance with the teachings herein, the repeated bits 1622 do not include both the output and the repetition input of any of the four XORs of the XOR group 1608.

Similar to FIG. 15, FIG. 17 shows another way that repeat bits can be split between the top (beginning) half and the bottom (end) half of the output bits. In this example, the bits to be repeated 1722 include outputs bits 1704-1, 1704-6, and 1704-7. The bit swap 1724 of FIG. 17 is relative to FIG. 16. Specifically, the output bit 1704-1 is repeated instead of the output bit 1704-5 (contrast FIG. 16 where the repeated bits 1622 include the output bit 1604-5). In accordance with the teachings herein, the repeated bits 1722 do not include both the output and the repetition input of any of the four XORs of the XOR group 1708.

From the above, it may be seen that all of the configurations achieve the same erasure probability results. This is because, in each configuration, the repeated bits do not include both the output and the repetition input of an XOR of any of the XORs of the XOR group 402 (e.g., the parity-check XOR group). The actual configuration selected may depend on various criteria. For example, it may be easier to use contiguous bits. It should be appreciated that other configurations (e.g., with a different number of repeated bits, a different number of output bits, different bit splitting, different bit grouping, etc.) may be used in accordance with the teachings herein.

Example Apparatus

Figure 18:
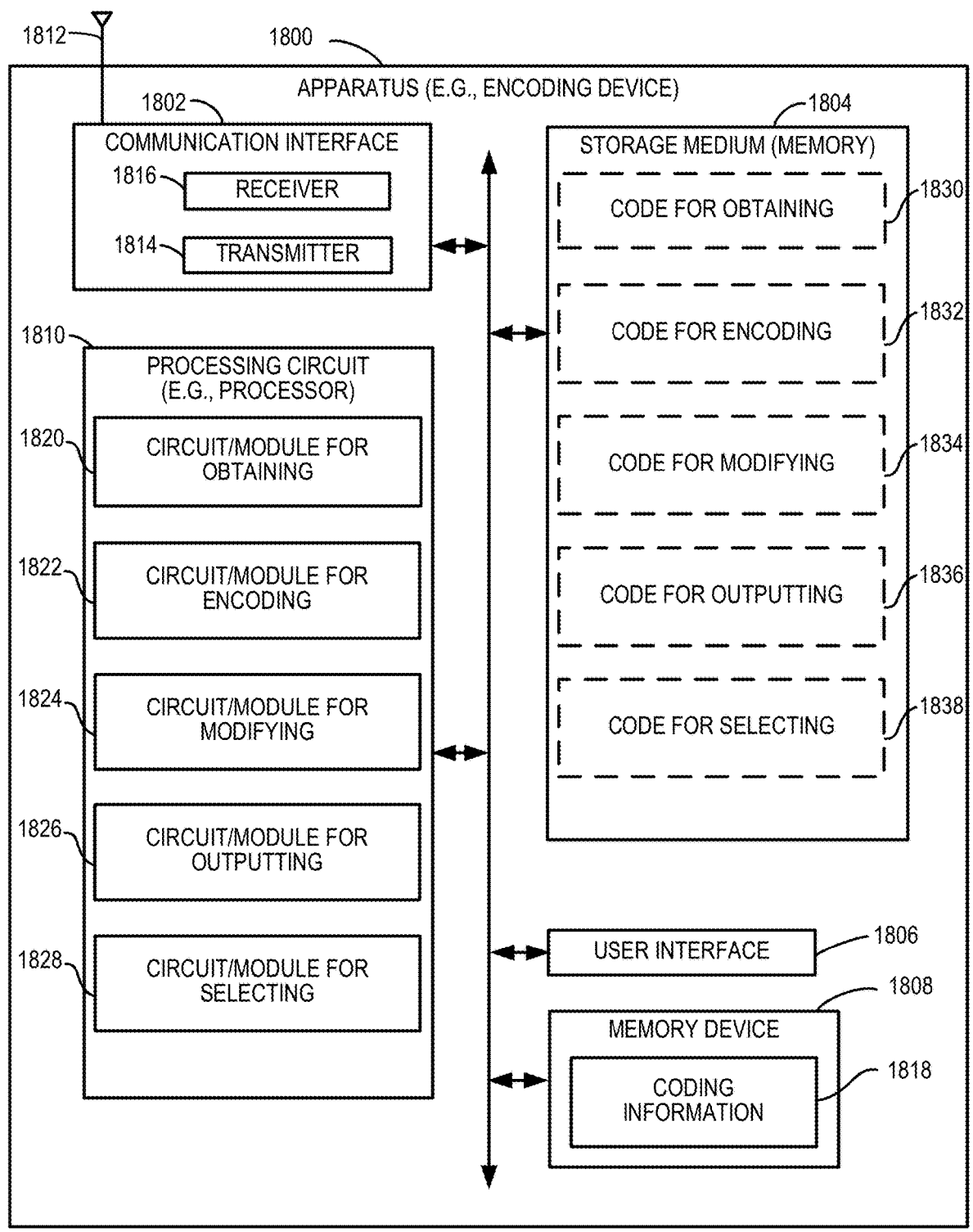
FIG. 18 is a block diagram illustrating an example hardware implementation for an apparatus (e.g., an electronic device) that can support encoding in accordance with some aspects of the disclosure.

FIG. 18 is an illustration of an apparatus 1800 that may use encoding according to one or more aspects of the disclosure. The apparatus 1800 could embody or be implemented within a UE, a TRP, a gNB, an access point, or some other type of device that uses encoding. In various implementations, the apparatus 1800 could embody or be implemented within an access terminal, a base station, or some other type of device. In various implementations, the apparatus 1800 could embody or be implemented within a mobile phone, a smart phone, a tablet, a portable computer, a server, a personal computer, a sensor, an alarm, a vehicle, a machine, an entertainment device, a medical device, or any other electronic device having circuitry.

The apparatus 1800 includes a communication interface 1802 (e.g., at least one transceiver), a storage medium 1804, a user interface 1806, a memory device 1808, and a processing circuit 1810 (e.g., at least one processor). These components can be coupled to and/or placed in electrical communication with one another via a signaling bus or other suitable component, represented generally by the connection lines in FIG. 18. The signaling bus may include any number of interconnecting buses and bridges depending on the specific application of the processing circuit 1810 and the overall design constraints. The signaling bus links together various circuits such that each of the communication interface 1802, the storage medium 1804, the user interface 1806, and the memory device 1808 are coupled to and/or in electrical communication with the processing circuit 1810. The signaling bus may also link various other circuits (not shown) such as timing sources, peripherals, voltage regulators, and power management circuits, which are well known in the art, and therefore, will not be described any further.

The communication interface 1802 may be adapted to facilitate wireless communication of the apparatus 1800. For example, the communication interface 1802 may include circuitry and/or programming adapted to facilitate the communication of information bi-directionally with respect to one or more communication devices in a network. Thus, in some implementations, the communication interface 1802 may be coupled to one or more antennas 1812 for wireless communication within a wireless communication system. In some implementations, the communication interface 1802 may be configured for wire-based communication. For example, the communication interface 1802 could be a bus interface, a send/receive interface, or some other type of signal interface including drivers, buffers, or other circuitry for outputting and/or obtaining signals (e.g., outputting signals from and/or receiving signals into an integrated circuit). The communication interface 1802 can be configured with one or more standalone receivers and/or transmitters, as well as one or more transceivers. In the illustrated example, the communication interface 1802 includes a transmitter 1814 and a receiver 1816.

The memory device 1808 may represent one or more memory devices. As indicated, the memory device 1808 may maintain coding-related information 1818 along with other information used by the apparatus 1800. In some implementations, the memory device 1808 and the storage medium 1804 are implemented as a common memory component. The memory device 1808 may also be used for storing data that is manipulated by the processing circuit 1810 or some other component of the apparatus 1800.

The storage medium 1804 may represent one or more computer-readable, machine-readable, and/or processor-readable devices for storing programming, such as processor executable code or instructions (e.g., software, firmware), electronic data, databases, or other digital information. The storage medium 1804 may also be used for storing data that is manipulated by the processing circuit 1810 when executing programming. The storage medium 1804 may be any available media that can be accessed by a general purpose or special purpose processor, including portable or fixed storage devices, optical storage devices, and various other mediums capable of storing, containing or carrying programming.

By way of example and not limitation, the storage medium 1804 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 1804 may be embodied in an article of manufacture (e.g., a computer program product). By way of example, a computer program product may include a computer-readable medium in packaging materials. In view of the above, in some implementations, the storage medium 1804 may be a non-transitory (e.g., tangible) storage medium.

The storage medium 1804 may be coupled to the processing circuit 1810 such that the processing circuit 1810 can read information from, and write information to, the storage medium 1804. That is, the storage medium 1804 can be coupled to the processing circuit 1810 so that the storage medium 1804 is at least accessible by the processing circuit 1810, including examples where at least one storage medium is integral to the processing circuit 1810 and/or examples where at least one storage medium is separate from the processing circuit 1810 (e.g., resident in the apparatus 1800, external to the apparatus 1800, distributed across multiple entities, etc.).

Programming stored by the storage medium 1804, when executed by the processing circuit 1810, causes the processing circuit 1810 to perform one or more of the various functions and/or process operations described herein. For example, the storage medium 1804 may include operations configured for regulating operations at one or more hardware blocks of the processing circuit 1810, as well as to utilize the communication interface 1802 for wireless communication utilizing their respective communication protocols. In some aspects, the storage medium 1104 may be a non-transitory computer-readable medium storing computer-executable code, including code to perform operations as described herein.

The processing circuit 1810 is generally adapted for processing, including the execution of such programming stored on the storage medium 1804. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1810 is arranged to obtain, process and/or send data, control data access and storage, issue commands, and control other desired operations. The processing circuit 1810 may include circuitry configured to implement desired programming provided by appropriate media in at least one example. For example, the processing circuit 1810 may be implemented as one or more processors, one or more controllers, and/or other structure configured to execute executable programming Examples of the processing circuit 1810 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1810 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 1810 are for illustration and other suitable configurations within the scope of the disclosure are also contemplated.

According to one or more aspects of the disclosure, the processing circuit 1810 may be adapted to perform any or all of the features, processes, functions, operations and/or routines for any or all of the apparatuses described herein. For example, the processing circuit 1810 may be configured to perform any of the steps, functions, and/or processes described with respect to FIGS. 1-17, 19, and 20. As used herein, the term "adapted" in relation to the processing circuit 1810 may refer to the processing circuit 1810 being one or more of configured, used, implemented, and/or programmed to perform a particular process, function, operation and/or routine according to various features described herein.

The processing circuit 1810 may be a specialized processor, such as an application specific integrated circuit (ASIC) that serves as a means for (e.g., structure for) carrying out any one of the operations described in conjunction with FIGS. 1-17, 19, and 20. The processing circuit 1810 may serve as one example of a means for transmitting and/or a means for receiving. In various implementations, the processing circuit 1810 may provide and/or incorporate, at least in part, the functionality described above for the first wireless communication device 202 (e.g., the encoder 212) of FIG. 2.

According to at least one example of the apparatus 1800, the processing circuit 1810 may include one or more of a circuit/module for obtaining 1820, a circuit/module for encoding 1822, a circuit/module for modifying 1824, a circuit/module for outputting 1826, or a circuit/module for selecting 1828. In various implementations, the circuit/module for obtaining 1820, the circuit/module for encoding 1822, the circuit/module for modifying 1824, the circuit/module for outputting 1826, or the circuit/module for selecting 1828 may provide and/or incorporate, at least in part, the functionality described above for the first wireless communication device 202 (e.g., the encoder 212) of FIG. 2.

As mentioned above, programming stored by the storage medium 1804, when executed by the processing circuit 1810, causes the processing circuit 1810 to perform one or more of the various functions and/or process operations described herein. For example, the programming may cause the processing circuit 1810 to perform the various functions, steps, and/or processes described herein with respect to FIGS. 1-17, 19, and 20 in various implementations. As shown in FIG. 18, the storage medium 1804 may include one or more of code for obtaining 1830, code for encoding 1832, code for modifying 1834, code for outputting 1836, or code for selecting 1838. In various implementations, the code for obtaining 1830, the code for encoding 1832, the code for modifying 1834, the code for outputting 1836, of the code for selecting 1838 may be executed or otherwise used to provide the functionality described herein for the circuit/module for obtaining 1820, the circuit/module for encoding 1822, the circuit/module for modifying 1824, the circuit/module for outputting 1826, or the circuit/module for selecting 1828.

The circuit/module for obtaining 1820 may include circuitry and/or programming (e.g., code for obtaining 1830 stored on the storage medium 1804) adapted to perform several functions relating to, for example, obtaining information (which may also be referred to as data). In some scenarios, the circuit/module for obtaining 1820 may receive information (e.g., from the communication interface 1802, the memory device 1808, or some other component of the apparatus 1800) and process (e.g., decode) the information. In some scenarios (e.g., if the circuit/module for obtaining 1820 is or includes an RF receiver), the circuit/module for obtaining 1820 may receive information directly from a device that transmitted the information. In either case, the circuit/module for obtaining 1820 may output the obtained information to another component of the apparatus 1800 (e.g., the circuit/module for encoding 1822, the memory device 1808, or some other component).

The circuit/module for obtaining 1820 (e.g., a means for obtaining) may take various forms. In some aspects, the circuit/module for obtaining 1820 may correspond to, for example, a processing circuit as discussed herein. In some aspects, the circuit/module for obtaining 1820 may correspond to, for example, an interface (e.g., a bus interface, a receive interface, or some other type of signal interface), a communication device, a transceiver, a receiver, or some other similar component as discussed herein. In some implementations, the communication interface 1802 includes the circuit/module for obtaining 1820 and/or the code for obtaining 1830. In some implementations, the circuit/module for obtaining 1820 and/or the code for obtaining 1830 is configured to control the communication interface 1802 (e.g., a transceiver or a receiver) to communicate the information.

The circuit/module for encoding 1822 may include circuitry and/or programming (e.g., code for encoding 1832 stored on the storage medium 1804) adapted to perform several functions relating to, for example, encoding information. In some aspects, the circuit/module for encoding 1822 (e.g., a means for encoding) may correspond to, for example, a processing circuit.

In some aspects, the circuit/module for encoding 1822 may execute an encoding algorithm on at least one input (e.g., obtained from the circuit/module for obtaining 1820, the memory device 1808, or some other component of the apparatus 1800). For example, the circuit/module for encoding 1822 may perform a block coding algorithm or a Polar coding algorithm. In some aspects, the circuit/module for encoding 1822 may perform one or more of the encoding-related operations described above in conjunction with FIGS. 1-17. The circuit/module for encoding 1822 then outputs the resulting encoded information (e.g., to the circuit/module for modifying 1824, the communication interface 1802, the memory device 1808, or some other component).

The circuit/module for modifying 1824 may include circuitry and/or programming (e.g., code for modifying 1834 stored on the storage medium 1804) adapted to perform several functions relating to, for example, modifying a codeword. In some aspects, the circuit/module for modifying 1824 (e.g., a means for modifying) may correspond to, for example, a processing circuit.

In some aspects, the circuit/module for modifying 1824 may obtain input information (e.g., from the means for encoding 1822, the memory device 1808, or some other component). For example, the circuit/module for modifying 1824 may modify a received codeword in conjunction with a puncture operation or a repetition operation (e.g., as described above in conjunction with FIGS. 1-17). The circuit/module for modifying 1824 may then generate an output based on the modifying (e.g., a modified codeword) and provide the output to a component of the apparatus 1800 (e.g., the circuit/module for outputting 1826, the memory device 1808, or some other component).

The circuit/module for outputting 1826 may include circuitry and/or programming (e.g., code for outputting 1836 stored on the storage medium 1804) adapted to perform several functions relating to, for example, outputting (e.g., sending or transmitting) information. In some implementations, the circuit/module for outputting 1826 may obtain information (e.g., from the circuit/module for modifying 1824, the memory device 1808, or some other component of the apparatus 1800) and process the information (e.g., encode the information for transmission). In some scenarios, the circuit/module for outputting 1826 sends the information to another component (e.g., the transmitter 1814, the communication interface 1802, or some other component) that will send the information to another device. In some scenarios (e.g., if the circuit/module for outputting 1826 includes a transmitter), the circuit/module for outputting 1826 transmits the information directly to another device (e.g., the ultimate destination) via radio frequency signaling or some other type of signaling suitable for the applicable communication medium.

The circuit/module for outputting 1826 (e.g., a means for outputting) may take various forms. In some aspects, the circuit/module for outputting 1826 may correspond to, for example, a processing circuit as discussed herein. In some aspects, the circuit/module for outputting 1826 may correspond to, for example, an interface (e.g., a bus interface, a send interface, or some other type of signal interface), a communication device, a transceiver, a transmitter, or some other similar component as discussed herein. In some implementations, the communication interface 1802 includes the circuit/module for outputting 1826 and/or the code for outputting 1836. In some implementations, the circuit/module for outputting 1826 and/or the code for outputting 1836 is configured to control the communication interface 1802 (e.g., a transceiver or a transmitter) to transmit information.

The circuit/module for selecting 1828 may include circuitry and/or programming (e.g., code for selecting 1838 stored on the storage medium 1804) adapted to perform several functions relating to, for example, selecting a pattern. In some aspects, the circuit/module for selecting 1828 (e.g., a means for selecting) may correspond to, for example, a processing circuit.

The circuit/module for selecting 1828 may make a selection based on one or more inputs. Thus, the circuit/module for selecting 1828 may initially obtain input information (e.g., from the memory device 1808, or some other component of the apparatus 1800). For example, the circuit/module for selecting 1828 may select a puncture pattern or a repetition pattern based on consecutive bits, bit tuples, or other information (e.g., as described above in conjunction with FIGS. 1-17). The circuit/module for selecting 1828 may then output an indication of the selection (e.g., to the circuit/module for modifying 1824, the memory device 1808, an encoder, or some other component).

Figure 19:
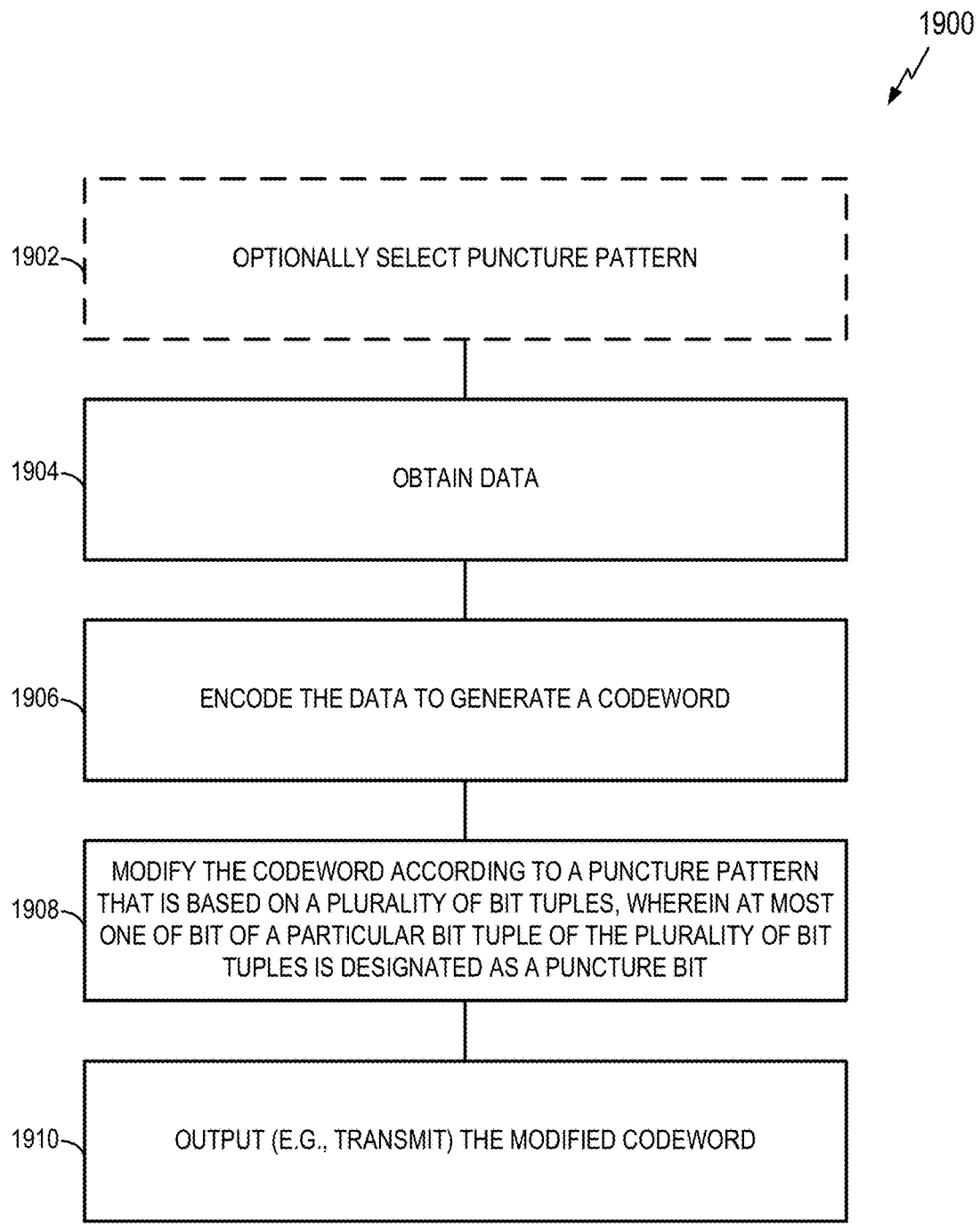
FIG. 19 is a flowchart illustrating an example of an encoding process with puncturing in accordance with some aspects of the disclosure.

In view of the above, the teachings herein may be used to improve the encoding performance the apparatus 1800 (e.g., improve the encoding performance of the processing circuit 1810). For example, by configuring the processing circuit 1810 to use a puncturing pattern and/or a repetition pattern generated as discussed above and in conjunction with FIGS. 19 and 20 below, the processing circuit 1810 may provide more reliable encoding as compared to the encoding the processing circuit 1810 may provide if some other puncturing scheme and/or repetition scheme was used. This higher reliability may be achieved, for example, by sending information over the bits with the lowest erasure probabilities as discussed above. Thus, fewer retransmissions may be needed by using puncturing and/or repetition as taught herein instead of other puncturing and repetition schemes that do not encode information in this manner Example Processes FIG. 19 illustrates a process 1900 for communication in accordance with some aspects of the disclosure. The process 1900 may take place within a processing circuit (e.g., the processing circuit 1810 of FIG. 18), which may be located in an access terminal, a TRP, a gNB, a base station, or some other suitable apparatus (e.g., that provides encoding). Of course, in various aspects within the scope of the disclosure, the process 1900 may be implemented by any suitable apparatus capable of supporting communication-related operations.

At optional block 1902, an apparatus (e.g., a device that include an encoder) may select a puncture pattern. In some aspects, the selection of the puncture pattern may include selecting a set of consecutive bits at a beginning of the codeword. In some aspects, the selection of the puncture pattern may include selecting a set of consecutive bits at an end of the codeword. In some aspects, the selection of the puncture pattern may include selecting a bit of the codeword that is a particular output of a last stage of an encoder for the encoding (e.g., the last stage of the Polar coding function), and not selecting a bit of the codeword that is an input of an XOR for the particular output of the last stage. In some aspects, the selection of the puncture pattern may include dividing bits of the codeword into bit pairs, and selecting at most one bit from each bit pair as a bit to be punctured. In some aspects, the bit pairs may be mutually exclusively associated with XORs of a last stage of an encoder for the encoding, and bits of a particular bit pair of the bit pairs may be mutually exclusively associated with an output of a particular XOR of the XORs and a repetition input of the particular XOR. In some aspects, the selection of the puncture pattern may include selecting between a set of consecutive bits at a beginning of the codeword, or a set of consecutive bits at an end of the codeword.

In some aspects, the selection of the puncture pattern may include selecting bits of the codeword that are not the output and the repetition input of the same XOR of a last stage of an encoder graph for the encoding (e.g., the last stage of the Polar coding function). In some aspects, the selection of the puncture pattern may include dividing bits of the codeword into bit pairs and, for each bit pair, selecting at most one bit from the bit pair as a bit to be punctured. In some aspects, the bit pairs may be mutually exclusively associated with XORs of a last stage of an encoder graph for the encoding and, for each of the bit pairs, the bits of the bit pair may be mutually exclusively associated with the output and the repetition input of the associated XOR.

In some implementations, the circuit/module for selecting 1828 of FIG. 18 performs the operations of block 1902. In some implementations, the code for selecting 1838 of FIG. 18 is executed to perform the operations of block 1902.

At block 1904, the apparatus obtains data. For example, the apparatus may retrieve the data from memory or receive the data from another apparatus. As used herein, the term data refers to information generally. For example, data may include user data, control information, and so on.

In some implementations, the circuit/module for obtaining 1820 of FIG. 18 performs the operations of block 1904. In some implementations, the code for obtaining 1830 of FIG. 18 is executed to perform the operations of block 1904.

At block 1906, the apparatus encodes the data to generate a codeword. In some aspects, the encoding may include Polar coding.

In some implementations, the circuit/module for encoding 1822 of FIG. 18 performs the operations of block 1906. In some implementations, the code for encoding 1832 of FIG. 18 is executed to perform the operations of block 1906.

At block 1908, the apparatus modifies the codeword according to a puncture pattern that is based on a plurality of bit tuples. Here, at most one bit of a particular bit tuple of the plurality of bit tuples is designated as a puncture bit.

In some aspects, the bit tuples may be mutually exclusively associated with logical blocks of a particular stage of an encoder for the encoding. In some aspects, the logical blocks may be XORs. In some aspects, a first one of the XORs may be part of a first path of the particular stage of the encoder, and a second one of the XORs may be part of a second path of the particular stage of the encoder. In some aspects, the particular stage may include (e.g., may be) a last stage prior to puncture of the codeword. In some aspects, the particular bit tuple may be associated with an XOR of an encoder for the encoding, the particular bit tuple may include a first bit and a second bit, and the first bit and the second bit may be mutually exclusively associated with an output of the XOR and a repetition input of the XOR. In some aspects, the particular bit tuple may be associated with an XOR of an encoder for the encoding, an input of the XOR may include (e.g., may be) a first output of the encoder, and an output of the XOR may include (e.g., may be) a second output of the encoder. In some aspects, for each of the bit tuples: at most one bit of the bit tuple is designated as a puncture bit, and bits of the bit tuple may be mutually exclusively associated with an output and a repetition input of an associated XOR.

In some aspects, the bit tuples may be mutually exclusively associated with XORs of a last stage of an encoder graph for the encoding and, for each of the bit tuples, the bits of the bit tuple may be mutually exclusively associated with the output and the repetition input of the associated XOR. In some aspects, each XOR may be part of a corresponding parity check path of the Polar coding function (e.g., in the last stage of the encoder graph).

In some implementations, the circuit/module for modifying 1824 of FIG. 18 performs the operations of block 1908. In some implementations, the code for modifying 1834 of FIG. 18 is executed to perform the operations of block 1908.

At block 1910, the apparatus outputs (e.g., transmits) the modified codeword. For example, the apparatus may store the modified codeword in memory or send the modified codeword to another apparatus. As another example, the apparatus may transmit the modified codeword via an antenna to another apparatus (e.g., via RF signaling).

In some implementations, the circuit/module for outputting 1826 of FIG. 18 performs the operations of block 1910. In some implementations, the code for outputting 1836 of FIG. 18 is executed to perform the operations of block 1910.

In some aspects, the process 1900 may include any combination of the operations described above for FIG. 19.

Figure 20:
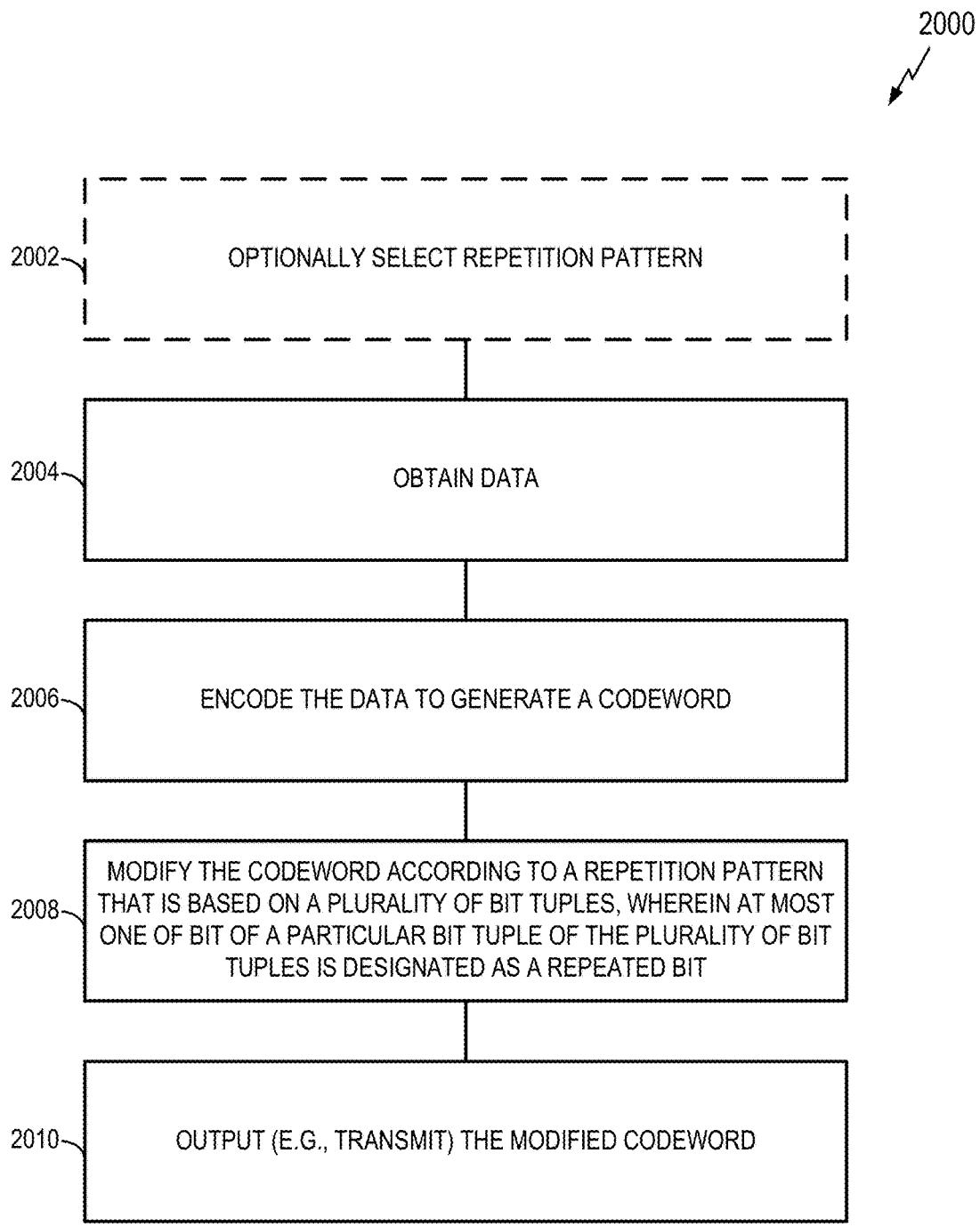
FIG. 20 is a flowchart illustrating an example of an encoding process with repetition in accordance with some aspects of the disclosure.

FIG. 20 illustrates a process 2000 for communication in accordance with some aspects of the disclosure. The process 2000 may take place within a processing circuit (e.g., the processing circuit 1810 of FIG. 18), which may be located in an access terminal, a TRP, a gNB, a base station, or some other suitable apparatus (e.g., that provides encoding). Of course, in various aspects within the scope of the disclosure, the process 2000 may be implemented by any suitable apparatus capable of supporting communication-related operations.

At optional block 2002, an apparatus (e.g., a device that include an encoder) may select a repetition pattern. In some aspects, the selection of the repetition pattern may include selecting a set of consecutive bits at a beginning of the codeword. In some aspects, the selection of the repetition pattern may include selecting a set of consecutive bits at an end of the codeword. In some aspects, the selection of the puncture pattern may include selecting a bit of the codeword that is a particular output of a last stage of an encoder for the encoding (e.g., the last stage of the Polar coding function), and not selecting a bit of the codeword that is an input of an XOR for the particular output of the last stage. In some aspects, the selection of the puncture pattern may include dividing bits of the codeword into bit pairs, and selecting at most one bit from each bit pair as a bit to be repeated. In some aspects, the bit pairs may be mutually exclusively associated with XORs of a last stage of an encoder for the encoding, and bits of a particular bit pair of the bit pairs may be mutually exclusively associated with an output of a particular XOR of the XORs and a repetition input of the particular XOR. In some aspects, the selection of the repetition pattern may include selecting between a set of consecutive bits at a beginning of the codeword, or a set of consecutive bits at an end of the codeword.

In some aspects, the selection of the repetition pattern may include selecting bits of the codeword that are not the output and the repetition input of the same XOR of a last stage of an encoder graph for the encoding. In some aspects, the selection of the repetition pattern may include dividing bits of the codeword into bit pairs and, for each bit pair, selecting at most one bit from the bit pair as a bit to be repeated. In some aspects, the bit pairs may be mutually exclusively associated with XORs of a last stage of an encoder graph for the encoding and, for each of the bit pairs, the bits of the bit pair may be mutually exclusively associated with the output and the repetition input of the associated XOR.

In some implementations, the circuit/module for selecting 1828 of FIG. 18 performs the operations of block 2002. In some implementations, the code for selecting 1838 of FIG. 18 is executed to perform the operations of block 2002.

At block 2004, the apparatus obtains data. For example, the apparatus may retrieve the data from memory or receive the data from another apparatus. As used herein, the term data refers to information generally. For example, data may include user data, control information, and so on.

In some implementations, the circuit/module for obtaining 1820 of FIG. 18 performs the operations of block 2004. In some implementations, the code for obtaining 1830 of FIG. 18 is executed to perform the operations of block 2004.

At block 2006, the apparatus encodes the data to generate a codeword. In some aspects, the encoding may include Polar coding.

In some implementations, the circuit/module for encoding 1822 of FIG. 18 performs the operations of block 2006. In some implementations, the code for encoding 1832 of FIG. 18 is executed to perform the operations of block 2006.

At block 2008, the apparatus modifies the codeword according to a repetition pattern that is based on a plurality of bit tuples. Here, at most one bit of a particular bit tuple of the plurality of bit tuples is designated as a repeated bit.

In some aspects, the bit tuples may be mutually exclusively associated with logical blocks of a particular stage of an encoder for the encoding. In some aspects, the logical blocks may be XORs. In some aspects, a first one of the XORs may be part of a first path of the particular stage of the encoder, and a second one of the XORs may be part of a second path of the particular stage of the encoder. In some aspects, the particular stage may include (e.g., may be) a last stage prior to repetition of the codeword. In some aspects, the particular bit tuple may be associated with an XOR of an encoder for the encoding, the particular bit tuple may include a first bit and a second bit, and the first bit and the second bit may be mutually exclusively associated with an output of the XOR and a repetition input of the XOR. In some aspects, the particular bit tuple may be associated with an XOR of an encoder for the encoding, an input of the XOR may include (e.g., may be) a first output of the encoder, and an output of the XOR may include (e.g., may be) a second output of the encoder. In some aspects, for each of the bit tuples: at most one bit of the bit tuple is designated as a repetition bit, and bits of the bit tuple may be mutually exclusively associated with an output and a repetition input of an associated XOR.

In some aspects, the bit tuples may be mutually exclusively associated with XORs of a last stage of an encoder graph for the encoding and, for each of the bit tuples, the bits of the bit tuple may be mutually exclusively associated with the output and the repetition input of the associated XOR. In some aspects, each XOR may be part of a corresponding parity check path of the Polar coding function.

In some implementations, the circuit/module for modifying 1824 of FIG. 18 performs the operations of block 2008. In some implementations, the code for modifying 1834 of FIG. 18 is executed to perform the operations of block 2008.

At block 2010, the apparatus outputs (e.g., transmits) the modified codeword. For example, the apparatus may store the modified codeword in memory or send the modified codeword to another apparatus. As another example, the apparatus may transmit the modified codeword via an antenna to another apparatus (e.g., via RF signaling).

In some implementations, the circuit/module for outputting 1826 of FIG. 18 performs the operations of block 2010. In some implementations, the code for outputting 1836 of FIG. 18 is executed to perform the operations of block 2010.

In some aspects, the process 2000 may include any combination of the operations described above for FIG. 20.

Additional Aspects

The examples set forth herein are provided to illustrate certain concepts of the disclosure. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As those skilled in the art will readily appreciate, various aspects described throughout this disclosure may be extended to any suitable telecommunication system, network architecture, and communication standard. By way of example, various aspects may be applied to wide area networks, peer-to-peer network, local area network, other suitable systems, or any combination thereof, including those described by yet-to-be defined standards.

Many aspects are described in terms of sequences of actions to be performed by, for example, elements of a computing device. It will be recognized that various actions described herein can be performed by specific circuits, for example, central processing units (CPUs), graphic processing units (GPUs), digital signal processors (DSPs), application specific integrated circuits (ASICs), field programmable gate arrays (FPGAs), or various other types of general purpose or special purpose processors or circuits, by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

One or more of the components, steps, features and/or functions illustrated in above may be rearranged and/or combined into a single component, step, feature or function or embodied in several components, steps, or functions. Additional elements, components, steps, and/or functions may also be added without departing from novel features disclosed herein. The apparatus, devices, and/or components illustrated above may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example of a storage medium is coupled to the processor such that the processor can read information from, and write information to, the storage medium. In the alternative, the storage medium may be integral to the processor.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "one or more of a, b, or c" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

While the foregoing disclosure shows illustrative aspects, it should be noted that various changes and modifications could be made herein without departing from the scope of the appended claims. The functions, steps or actions of the method claims in accordance with aspects described herein need not be performed in any particular order unless expressly stated otherwise. Furthermore, although elements may be described or claimed in the singular, the plural is contemplated unless limitation to the singular is explicitly stated.

What is claimed is:

1. A method of communication, comprising:
obtaining data;
encoding the data to generate a codeword;
modifying the codeword according to a puncture pattern that is based on a plurality of bit tuples, wherein at most only one bit of a particular bit tuple of the plurality of bit tuples is designated as a puncture bit, wherein the bit tuples are mutually exclusively associated with logical blocks of a particular stage of an encoder for the encoding; and transmitting the modified codeword.

2. The method of claim 1, wherein the logical blocks are XORs.

3. The method of claim 2, wherein:
a first one of the XORs is part of a first path of the particular stage of the encoder; and
a second one of the XORs is part of a second path of the particular stage of the encoder.

4. The method of claim 1, wherein the particular stage comprises a last stage prior to puncture of the codeword.

5. The method of claim 1, wherein:
the particular bit tuple is associated with an XOR of an encoder for the encoding;
the particular bit tuple comprises a first bit and a second bit; and
the first bit and the second bit are mutually exclusively associated with an output of the XOR and a repetition input of the XOR.

6. The method of claim 1, wherein:
the particular bit tuple is associated with an XOR of an encoder for the encoding;
an input of the XOR comprises a first output of the encoder; and
an output of the XOR comprises a second output of the encoder.

7. The method of claim 1, further comprising:
selecting the puncture pattern.

8. The method of claim 7, wherein the selection of the puncture pattern comprises:
selecting a set of consecutive bits at a beginning of the codeword.

9. The method of claim 7, wherein the selection of the puncture pattern comprises:
selecting a set of consecutive bits at an end of the codeword.

10. The method of claim 7, wherein the selection of the puncture pattern comprises:
selecting a bit of the codeword that is a particular output of a last stage of an encoder for the encoding; and
not selecting a bit of the codeword that is an input of an XOR for the particular output of the last stage.

11. The method of claim 7, wherein the selection of the puncture pattern comprises:
dividing bits of the codeword into bit pairs; and
selecting at most one bit from each bit pair as a bit to be punctured.

12. The method of claim 11, wherein:
the bit pairs are mutually exclusively associated with XORs of a last stage of an encoder for the encoding; and
bits of a particular bit pair of the bit pairs are mutually exclusively associated with an output of a particular XOR of the XORs and a repetition input of the particular XOR.

13. The method of claim 1, wherein, for each of the bit tuples:
at most one bit of the bit tuple is designated as a puncture bit; and
bits of the bit tuple are mutually exclusively associated with an output and a repetition input of an associated XOR.

14. The method of claim 1, wherein the encoding comprises Polar coding.

15. An apparatus for communication comprising:
an interface configured to obtain data;
a memory; and
a processor coupled to the memory and the interface, the processor and the memory configured to:
encode the data to generate a codeword, and
modify the codeword according to a puncture pattern that is based on a plurality of bit tuples, wherein at most only one bit of a particular bit tuple of the plurality of bit tuples is designated as a puncture bit,
wherein the bit tuples are mutually exclusively associated with logical blocks of a particular stage of an encoder for the encoding,
wherein the interface is further configured to transmit the modified codeword.

16. The apparatus of claim 15, wherein the logical blocks are XORs.

17. The apparatus of claim 16, wherein:
a first one of the XORs is part of a first path of the particular stage of the encoder; and
a second one of the XORs is part of a second path of the particular stage of the encoder.

18. The apparatus of claim 15, wherein the particular stage comprises a last stage prior to puncture of the codeword.

19. The apparatus of claim 15, wherein:
the particular bit tuple is associated with an XOR of an encoder for the encoding;
an input of the XOR comprises a first output of the encoder; and
an output of the XOR comprises a second output of the encoder.

20. The apparatus of claim 15, wherein the processor and the memory are further configured to:
select the puncture pattern.

21. The apparatus of claim 20, wherein the selection of the puncture pattern comprises selecting between:
a set of consecutive bits at a beginning of the codeword; or
a set of consecutive bits at an end of the codeword.

22. The apparatus of claim 20, wherein the selection of the puncture pattern comprises:
selecting a bit of the codeword that is a particular output of a last stage of an encoder for the encoding; and
not selecting a bit of the codeword that is an input of an XOR for the particular output of the last stage.

23. The apparatus of claim 15, wherein the encoding comprises Polar coding.

24. An apparatus for communication comprising:
means for obtaining data;
means for encoding the data to generate a codeword;
means for modifying the codeword according to a puncture pattern that is based on a plurality of bit tuples, wherein at most one bit of a particular bit tuple of the plurality of bit tuples is designated as a puncture bit; and
means for transmitting the modified codeword.

25. The apparatus of claim 24, wherein the bit tuples are mutually exclusively associated with XORs of a last stage of an encoder for the encoding.

26. The apparatus of claim 24, wherein:
the particular bit tuple is associated with an XOR of an encoder for the encoding;
an input of the XOR comprises a first output of the encoder; and
an output of the XOR comprises a second output of the encoder.

27. The apparatus of claim 24, further comprising:
means for selecting the puncture pattern.

28. A non-transitory computer-readable medium storing computer-executable code, including code to:
obtain data;
encode the data to generate a codeword;
modify the codeword according to a puncture pattern that is based on a plurality of bit tuples, wherein at most only one bit of a particular bit tuple of the plurality of bit tuples is designated as a puncture bit,
wherein the bit tuples are mutually exclusively associated with logical blocks of a particular stage of an encoder for the encoding; and
transmit the modified codeword.

29. A method of communication, comprising:
obtaining data;
encoding the data to generate a codeword;
modifying the codeword according to a repetition pattern that is based on a plurality of bit tuples, wherein at most only one bit of a particular bit tuple of the plurality of bit tuples is designated as a repeated bit,
wherein the bit tuples are mutually exclusively associated with logical blocks of a particular stage of an encoder for the encoding; and
transmitting the modified codeword.

30. The method of claim 29, wherein the logical blocks are XORs.

31. The method of claim 30, wherein:
a first one of the XORs is part of a first path of the particular stage of the encoder; and
a second one of the XORs is part of a second path of the particular stage of the encoder.

32. The method of claim 29, wherein the particular stage comprises a last stage prior to repetition of the codeword.

33. The method of claim 29, wherein:
the particular bit tuple is associated with an XOR of an encoder for the encoding;
the particular bit tuple comprises a first bit and a second bit; and
the first bit and the second bit are mutually exclusively associated with an output of the XOR and a repetition input of the XOR.

34. The method of claim 29, wherein:
the particular bit tuple is associated with an XOR of an encoder for the encoding;
an input of the XOR comprises a first output of the encoder; and
an output of the XOR comprises a second output of the encoder.

35. The method of claim 29, further comprising:
selecting the repetition pattern.

36. The method of claim 35, wherein the selection of the repetition pattern comprises:
selecting a set of consecutive bits at a beginning of the codeword.

37. The method of claim 35, wherein the selection of the repetition pattern comprises:
selecting a set of consecutive bits at an end of the codeword.

38. The method of claim 35, wherein the selection of the repetition pattern comprises:
selecting a bit of the codeword that is a particular output of a last stage of an encoder for the encoding; and
not selecting a bit of the codeword that is an input of an XOR for the particular output of the last stage.

39. The method of claim 35, wherein the selection of the repetition pattern comprises:
dividing bits of the codeword into bit pairs; and
selecting at most one bit from each bit pair as a bit to be repeated.

40. The method of claim 39, wherein:
the bit pairs are mutually exclusively associated with XORs of a last stage of an encoder for the encoding; and
bits of a particular bit pair of the bit pairs are mutually exclusively associated with an output of a particular XOR of the XORs and a repetition input of the particular XOR.

41. The method of claim 29, wherein, for each of the bit tuples:
at most one bit of the bit tuple is designated as a repetition bit; and
bits of the bit tuple are mutually exclusively associated with an output and a repetition input of an associated XOR.

42. The method of claim 29, wherein the encoding comprises Polar coding.

43. An apparatus for communication comprising:
an interface configured to obtain data;
a memory; and
a processor coupled to the memory and the interface, the processor and the memory configured to:
encode the data to generate a codeword, and
modify the codeword according to a repetition pattern that is based on a plurality of bit tuples, wherein at most only one bit of a particular bit tuple of the plurality of bit tuples is designated as a repeated bit,
wherein the bit tuples are mutually exclusively associated with logical blocks of a particular stage of an encoder for the encoding,
wherein the interface is further configured to transmit the modified codeword.

44. The apparatus of claim 43, wherein the logical blocks are XORs.

45. The apparatus of claim 44, wherein:
a first one of the XORs is part of a first path of the particular stage of the encoder; and
a second one of the XORs is part of a second path of the particular stage of the encoder.

46. The apparatus of claim 43, wherein the particular stage comprises a last stage prior to repetition of the codeword.

47. The apparatus of claim 43, wherein:
the particular bit tuple is associated with an XOR of an encoder for the encoding;
an input of the XOR comprises a first output of the encoder; and
an output of the XOR comprises a second output of the encoder.

48. The apparatus of claim 43, wherein the processor and the memory are further configured to:
select the repetition pattern.

49. The apparatus of claim 48, wherein the selection of the repetition pattern comprises selecting between:
a set of consecutive bits at a beginning of the codeword; or
a set of consecutive bits at an end of the codeword.

50. The apparatus of claim 48, wherein the selection of the repetition pattern comprises:
selecting a bit of the codeword that is a particular output of a last stage of an encoder for the encoding; and not selecting a bit of the codeword that is an input of an XOR for the particular output of the last stage.

51. The apparatus of claim 46, wherein the encoding comprises Polar coding.

52. An apparatus for communication comprising:
means for obtaining data;
means for encoding the data to generate a codeword;
means for modifying the codeword according to a repetition pattern that is based on a plurality of bit tuples, wherein at most one bit of a particular bit tuple of the plurality of bit tuples is designated as a repeated bit; and
means for transmitting the modified codeword.

53. The apparatus of claim 52, wherein the bit tuples are mutually exclusively associated with XORs of a last stage of an encoder for the encoding.

54. The apparatus of claim 52, wherein:
the particular bit tuple is associated with an XOR of an encoder for the encoding;
an input of the XOR comprises a first output of the encoder; and
an output of the XOR comprises a second output of the encoder.

55. The apparatus of claim 52, further comprising:
means for selecting the repetition pattern.

56. A non-transitory computer-readable medium storing computer-executable code, including code to:
obtain data;
encode the data to generate a codeword;
modify the codeword according to a repetition pattern that is based on a plurality of bit tuples,
wherein at most only one bit of a particular bit tuple of the plurality of bit tuples is designated as a repeated bit,
wherein the bit tuples are mutually exclusively associated with logical blocks of a particular stage of an encoder for the encoding; and
transmit the modified codeword.

* * * * *